(12) United States Patent
Karino et al.

(10) Patent No.: US 12,733,184 B2
(45) Date of Patent: Sep. 8, 2026

(54) SEMICONDUCTOR DEVICE

(71) Applicant: FUJI ELECTRIC CO., LTD., Kawasaki (JP)

(72) Inventors: Taichi Karino, Matsumoto-city (JP); Hitoshi Sumida, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 609 days.

(21) Appl. No.: 18/190,424

(22) Filed: Mar. 27, 2023

(65) Prior Publication Data

US 2023/0378245 A1 Nov. 23, 2023

(30) Foreign Application Priority Data

May 18, 2022 (JP) ................................ 2022-081376

(51) Int. Cl.
*H10D 1/47* (2025.01)
*H02M 7/5387* (2007.01)

(52) U.S. Cl.
CPC ............ *H10D 1/47* (2025.01); *H02M 7/5387* (2013.01)

(58) Field of Classification Search
CPC ....... H10D 1/47; H02M 7/5387; H01L 23/647
See application file for complete search history.

(56) References Cited

U.S. PATENT DOCUMENTS 10,727,180 B2 7/2020 Karino et al.
2019/0181089 A1 6/2019 Karino et al.
2020/0006449 A1* 1/2020 Yu .......................... H02H 9/045
2020/0395355 A1* 12/2020 Nagai ............... H02M 7/53871
2023/0275112 A1* 8/2023 Ejiri ...................... H10F 30/225 257/428

FOREIGN PATENT DOCUMENTS

| | | |
|---|---|---|
| CN | 215338658 U * | 12/2021 |
| JP | H-05235277 A | 9/1993 |
| JP | H-08195479 A | 7/1996 |
| JP | H-09275150 A | 10/1997 |
| JP | 2003023089 A * | 1/2003 |
| JP | 2019106485 A | 6/2019 |

* cited by examiner

*Primary Examiner* — Fernando L Toledo
*Assistant Examiner* — Marshall Mu-Nuo Hatfield

(57) ABSTRACT

A semiconductor device includes: a semiconductor substrate; a first insulating film provided on one surface of the semiconductor substrate; a first resistance layer including polysilicon provided on the first insulating film; a second insulating film provided on the first resistance layer; a second resistance layer including polysilicon provided on the second insulating film so as to overlap with the first resistance layer; a third insulating film provided on the second resistance layer; a first electrode provided over the third insulating film and electrically connected to the second resistance layer; and a second electrode electrically connected to the first resistance layer, wherein the first resistance layer and the second resistance layer each include a body part and a first contact part having a higher impurity concentration than the body part, and the respective first contact parts are in contact with each other.

17 Claims, 24 Drawing Sheets

SEMICONDUCTOR DEVICE

CROSS-REFERENCE TO RELATED APPLICATION

This application claims benefit of priority under 35 USC 119 based on Japanese Patent Application No. 2022-081376 filed on May 18, 2022, the entire contents of which are incorporated by reference herein.

BACKGROUND OF THE INVENTION

1. Field of the Invention

The present invention relates to a semiconductor device used for a gate resistive element of a switching element.

2. Description of the Related Art

JP 2019-106485 A discloses a vertical structure-type resistive chip used as a resistive element for a semiconductor integrated circuit (IC), for example, having a region serving as a resistor between a first electrode and a second electrode, the resistive chip including a resistance layer formed of a thin film of polysilicon provided on a semiconductor substrate via a first insulating film, the first electrode provided on the resistance layer via a second insulating film so as to be electrically connected to one end of the resistance layer, a relay wire provided on the second insulating film so as to be electrically connected to the other end of the resistance layer, and the second electrode provided under the semiconductor substrate so as to be electrically connected to the relay wire.

JP H05-235277 A discloses a semiconductor integrated circuit device including several kinds of polysilicon layers used as resistive elements in which resistance temperature properties show positive and negative values, the several kinds of the polysilicon resistive elements being connected to each other via polysilicon interlayer connection holes.

JP H08-195479 A discloses a semiconductor device including a plurality of layers of resistors stacked in a height direction on a semiconductor substrate including a semiconductor element via insulating films, in which the patterns of the resistors of the respective layers are electrically connected to each other.

JP H09-275150 A discloses a semiconductor memory including a load element used as a resistance in which at least two high-resistance layers are connected to each other via contact holes.

The resistive element disclosed in JP 2019-106485 A is required to have a resistance value appropriately set for each semiconductor module in which the resistive element is packaged. If a chip size of the resistive element is increased in order to increase the resistance value, the area in which the resistive element is packaged needs to be changed for each semiconductor module. Alternatively, the width of the resistor needs to be decreased in order to increase the resistance value without the chip size of the resistive element changed, but a variation in the resistance value is increased as the width of the resistor is decreased.

SUMMARY OF THE INVENTION

In view of the foregoing problems, the present invention provides a semiconductor device having a configuration capable of adjusting a resistance value without a change of a chip size and also avoiding a variation in the resistance value.

An aspect of the present invention inheres in a semiconductor device including: a semiconductor substrate; a first insulating film provided on one surface of the semiconductor substrate; a first resistance layer including polysilicon provided on the first insulating film; a second insulating film provided on the first resistance layer; a second resistance layer including polysilicon provided on the second insulating film so as to have at least a part overlapping with the first resistance layer; a third insulating film provided on the second resistance layer; a first electrode provided over the third insulating film and electrically connected to the second resistance layer; and a second electrode electrically connected to the first resistance layer, wherein the first resistance layer and the second resistance layer each include a body part and a first contact part having a higher impurity concentration than the body part, and the respective first contact parts of the first resistance layer and the second resistance layer are in contact with each other via a contact hole provided in the second insulating film.

BRIEF DESCRIPTION OF THE DRAWINGS

FIG. 2 is a cross-sectional view as viewed from direction A-A' in FIG. 1;

FIG. 17 is a cross-sectional view illustrating a semiconductor device according to a third embodiment;

DETAILED DESCRIPTION

Figure 1:
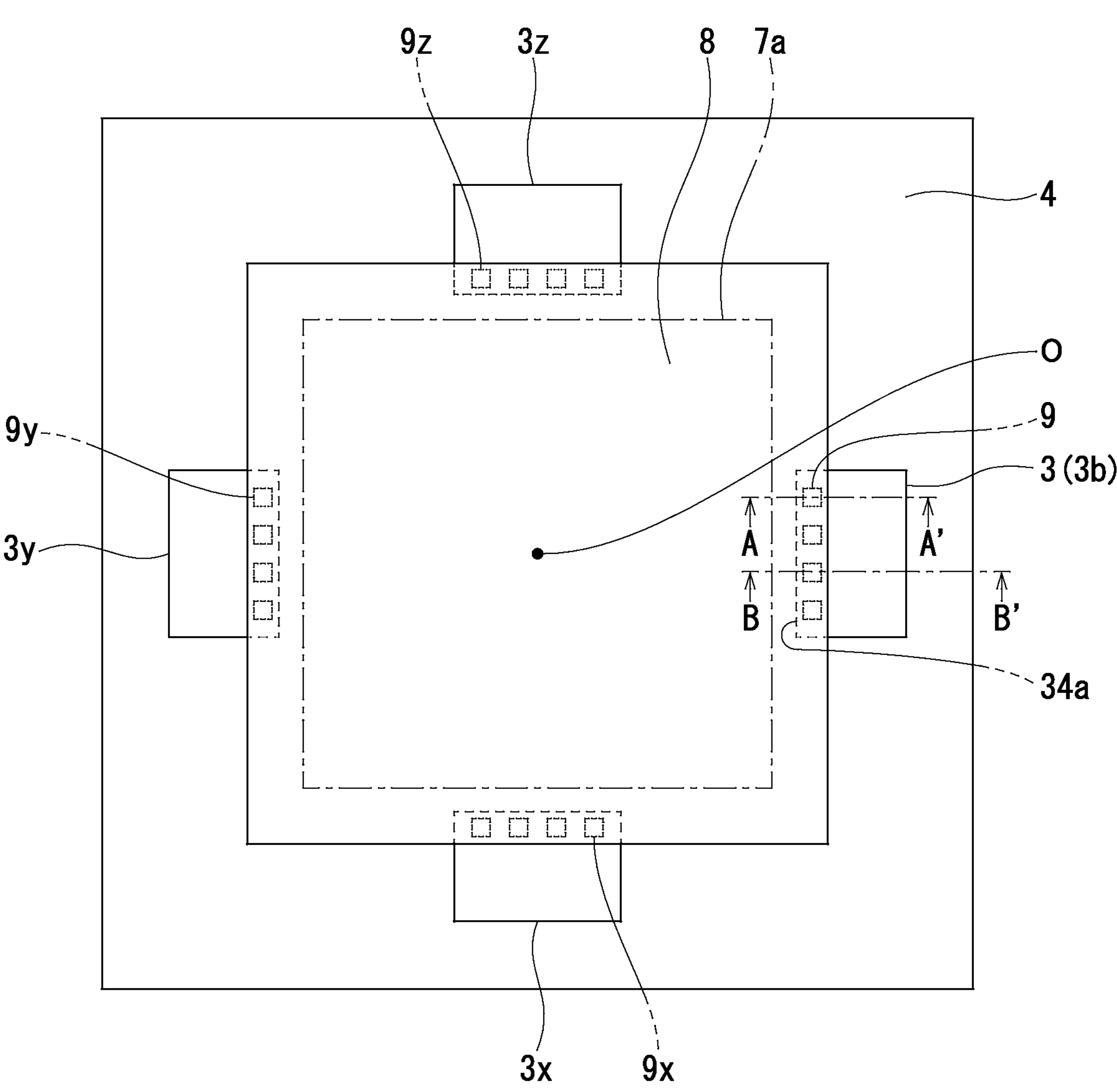
FIG. 1 is a plan view illustrating a semiconductor device according to a first embodiment.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. Similarly, when the relationship between the front and back is rotated by 180°, the inverted term is defined.

Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "p" and "p", it is not indicated that the semiconductor regions have exactly the same impurity concentration. Moreover, the members and the regions that are limited by adding "p-type" and "n-type" in the following description indicate the members and the regions formed of semiconductor materials without particular obvious limitations.

First Embodiment

<Configuration of Semiconductor Device>

A semiconductor device according to a first embodiment is a chip-shaped resistive element (a resistive chip) having a rectangular planar pattern, as illustrated in FIG. 1. The semiconductor device according to the first embodiment has a chip size of about 3 mm×3 mm, for example, which can be changed as appropriate. The planar pattern of the semiconductor device according to the first embodiment is not limited to the rectangular shape as illustrated in FIG. 1.

Figure 2:
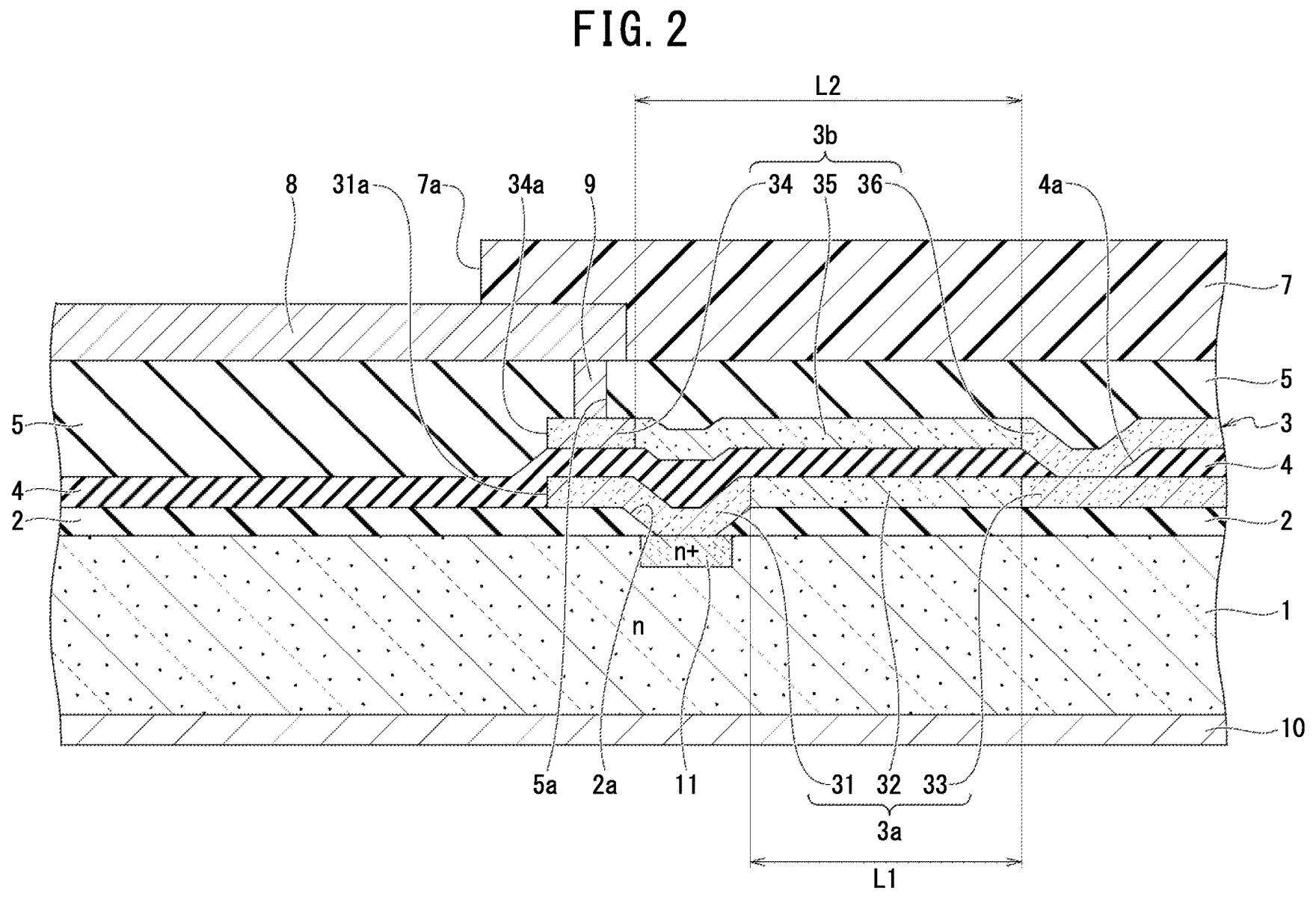

The semiconductor device according to the first embodiment includes a plurality of (four) resistance stacked structures 3, 3*x*, 3*y*, and 3*z* provided along the respective sides of the rectangular shape. FIG. 2 is a cross-sectional view taken along line A-A' across the resistance stacked structure 3 illustrated in FIG. 1. As illustrated in FIG. 2, the semiconductor device according to the first embodiment includes a semiconductor substrate 1 of n-type and the resistance stacked structure 3 provided over the semiconductor substrate 1. The resistance stacked structure 3 includes two resistance layers of a first resistance layer (a polysilicon resistor) 3*a* including polysilicon and a second resistance layer (a polysilicon resistor) 3*b* including polysilicon that are stacked together.

The semiconductor substrate 1 has a thickness of about 350 micrometers, for example. The semiconductor substrate 1 as used herein can be a substrate having a low specific resistance, such as a silicon substrate with n-type impurity ions heavily doped. The semiconductor substrate 1 preferably has a small amount of a resistive component reduced to a level that can be ignored with respect to that of the first resistance layer 3*a* and the second resistance layer 3*b*. The amount of the resistive component included in the semiconductor substrate 1 is preferably 1/100 or smaller of that of the first resistance layer 3*a* and the second resistance layer 3*b*. The specific resistance of the semiconductor substrate 1 may be set in a range of about 2 mΩ·cm to 60 mΩ·cm, for example. The semiconductor substrate 1 may be a silicon substrate with p-type impurity ions heavily doped or a semiconductor substrate not including silicon.

A contact region 11 of $n^+$-type is deposited at an upper part of the semiconductor substrate 1, the contact region 11 having the same conductivity type as the semiconductor substrate 1 and having a higher impurity concentration and a lower specific resistance than the semiconductor substrate 1. A contact region of $p^+$-type may be provided instead when the p-type semiconductor substrate 1 is used.

A first insulating film 2 that is a field insulating film is deposited on one surface (the top surface) of the semiconductor substrate 1. The first insulating film 2 has a thickness of about 800 nanometers, for example. The deposition of the thick first insulating film 2 can decrease a parasitic capacity. The first insulating film 2 may be a silicon oxide film (a $SiO_2$ film), a silicon nitride film (a $Si_3N_4$ film), or a composite film including these films. The first insulating film 2 may also be an insulating film obtained by a chemical vapor deposition (CVD) method using gas including an organic silicon-based compound such as tetraethoxysilane (TEOS), for example.

The first resistance layer 3*a* including polysilicon is deposited on the first insulating film 2. The first resistance layer 3*a* has a thickness of about 500 nanometers, and has a sheet resistance of about 150 Ω/sq, for example. The width of the first resistance layer 3*a* is defined in the backward direction in the sheet of FIG. 2, and the length of the first resistance layer 3*a* is defined in the right-left direction in the sheet of FIG. 2. The width of the first resistance layer 3*a* is preferably set to 400 micrometers or greater. The first resistance layer 3*a* when having the width of 400 micrometers or greater can avoid a variation in the resistance value of the first resistance layer 3*a*, and can thus avoid a variation in the resistance value of the entire semiconductor device according to the first embodiment.

A ratio of the width to the length of the first resistance layer 3*a* (W/L: L is the length and W is the width) is preferably 3.3 or greater. The ratio W/L set to 3.3 or greater can avoid the variation in the resistance value of the first resistance layer 3*a*, and can thus avoid the variation in the resistance value of the entire semiconductor device according to the first embodiment. The length of the first resistance layer 3*a* is preferably set to 120 micrometers or greater when the width of the first resistance layer 3*a* is set to 400 micrometers, for example.

The first resistance layer 3*a* as used herein can be a layer of n-type doped polysilicon (DOPOS), for example. The n-type DOPOS layer can be obtained such that n-type impurity ions such as phosphorus (P) are implanted in polycrystalline silicon (polysilicon), or can be obtained such that n-type impurities are doped into polycrystalline silicon during deposition of the polycrystalline silicon by use of a CVD device. The first resistance layer 3*a* may be a DOPOS layer of p-type instead. The p-type DOPOS layer can also be obtained by means of implanting p-type impurity ions such as boron (B) in polysilicon, for example.

The resistance value of the first resistance layer 3*a* can be regulated such that the width and the length of the first resistance layer 3*a* are adjusted. The resistance value of the first resistance layer 3*a* can also be regulated by the adjustment of the amount of the impurity element doped into polysilicon when the DOPOS layer is used as the first resistance layer 3*a*.

The first resistance layer 3*a* preferably has a temperature coefficient of 0 ppm/° C. or lower; in other words, the first resistance layer 3*a* preferably has a temperature coefficient of zero or has a negative temperature coefficient. Such a temperature coefficient can avoid an increase in the resistance value of the semiconductor device according to the first embodiment during the operation of a semiconductor module equipped with the semiconductor device according to the first embodiment at a high temperature. The temperature coefficient set as described above can prevent a turn-on loss of the IGBT when the semiconductor device according to the first embodiment is used as a gate resistive element of an insulated gate bipolar transistor (IGBT), for example.

The temperature coefficient of the DOPOS can be regulated such that the dose of the impurity ions implanted to the polysilicon is adjusted. Setting the dose to about $7.0\times10^{15}$ $cm^{-2}$ or less, for example, can let the temperature coefficient of the DOPOS to be 0 ppm/° C. or lower. The present embodiment is not limited to the temperature coefficient of the first resistance layer 3*a* set to 0 ppm/° C. or lower, and the first resistance layer 3*a* may have a positive temperature coefficient instead.

The first resistance layer 3*a* includes a body part 32, a contact part 31 provided in contact with one end of the body part 32 closer to the center of the chip and having the same conductivity type as the body part 32 and a higher impurity concentration than the body part 32, and a contact part 33 provided in contact with the other end of the body part 32 away from the center of the chip and having the same conductivity type as the body part 32 and a higher impurity concentration than the body part 32.

The body part 32 serves as a main resistive component of the first resistance layer 3*a*. The resistance value of the body part 32 can be regulated by the adjustment of the thickness of the body part 32, the length L1 of the body part 32 defined in the right-left direction in FIG. 2, the width of the body part 32 defined in the backward direction in the sheet of FIG. 2, and the impurity concentration of the body part 32.

The contact part 31 and the contact part 33 are provided so as to interpose the body part 32 in the middle. The contact part 31 and the contact part 33 may either have substantially the same impurity concentration or have impurity concentrations different from each other. The contact part 31 is located closer to the center of the chip (on the inner side of the contact part 33) than the contact part 33. The contact part 31 is in contact with the contact region 11 deposited at the upper part of the semiconductor substrate 1 via a contact hole 2*a* provided in the first insulating film 2. The contact part 31 is in ohmic contact with the contact region 11 at a low contact resistance.

A second insulating film 4 is deposited on the first insulating film 2 and the first resistance layer 3*a* so as to serve as an interlayer insulating film. Examples of the second insulating film 4 as used herein include a silicon oxide film (a SiO2 film) not containing impurity ions and typically referred to as a non-doped silicate glass (NSG) film, a phosphosilicate glass film (a PSG film), and a borosilicate glass film (a BSG film). Other examples that can also be used as the second insulating film 4 include a single-layer film of a borophosphosilicate glass film (a BPSG film) or a silicon nitride (Si3N4) film, and a composite film of any of the above films combined together.

The second resistance layer 3*b* including polysilicon is deposited on the top surface of the second insulating film 4 so as to have at least a part overlapping with the first resistance layer 3*a*. The second resistance layer 3*b* may have substantially the same configuration as the first resistance layer 3*a*. The second resistance layer 3*b* is a DOPOS layer of n-type that is the same conductivity type as the first resistance layer 3*a*. The first resistance layer 3*a* and the second resistance layer 3*b* may either have substantially the same impurity concentration or have impurity concentrations different from each other. The first resistance layer 3*a* and the second resistance layer 3*b* may either have substantially the same resistance value or have resistance values different from each other. The first resistance layer 3*a* and the second resistance layer 3*b* may either have substantially the same length or have lengths different from each other. The first resistance layer 3*a* and the second resistance layer 3*b* may either have substantially the same width or have widths different from each other.

The first resistance layer 3*a* and the second resistance layer 3*b* may either have substantially the same temperature coefficient or have temperature coefficients different from each other. For example, either the first resistance layer 3*a* or the second resistance layer 3*b* may have a positive temperature coefficient, and the other one may have a negative temperature coefficient, so as to offset the variation of the characteristics derived from the temperature to achieve a resistance having a small temperature coefficient as a whole.

The second resistance layer 3*b* includes a body part 35, a contact part 34 provided in contact with one end of the body part 35 closer to the center of the chip and having the same conductivity type as the body part 35 and a higher impurity concentration than the body part 35, and a contact part 36 provided in contact with the other end of the body part 35 away from the center of the chip and having the same conductivity type as the body part 35 and a higher impurity concentration than the body part 35.

The body part 35 serves as a main resistive component of the second resistance layer 3*b*. The resistance value of the body part 35 can be regulated by the adjustment of the thickness of the body part 35, the length L2 of the body part 35 defined in the right-left direction in FIG. 2, the width of the body part 35 defined in the backward direction in the sheet of FIG. 2, and the impurity concentration of the body part 35.

The contact part 34 and the contact part 36 are provided so as to interpose the body part 35 in the middle. The contact part 34 and the contact part 36 may either have substantially the same impurity concentration or have impurity concentrations from each other. The contact part 36 is in contact with the contact part 33 of the first resistance layer 3*a* via a contact hole 4*a* provided in the second insulating film 4. The contact part 36 is in ohmic contact with the contact part 33 at a low contact resistance.

The body part 32 of the first resistance layer 3*a* and the body part 35 of the second resistance layer 3*b* may either have substantially the same resistance value or have resistance values different from each other. The length L1 of the body part 32 of the first resistance layer 3*a* and the length L2 of the body part 35 of the second resistance layer 3*b* may be either substantially the same or different from each other. The body part 32 of the first resistance layer 3*a* and the body part 35 of the second resistance layer 3*b* may either have substantially the same width or have widths different from each other.

The first resistance layer 3*a* and the second resistance layer 3*b* are directly connected to each other via the respective contact parts 33 and 36 so as to implement the resistance stacked structure 3. The other resistance stacked structures 3*x*, 3*y*, and 3*z* illustrated in FIG. 1 have a structure similar to that of the resistance stacked structure 3 illustrated in FIG. 2, and are implemented by the two resistance layers stacked together.

As illustrated in FIG. 2, a third insulating film 5 serving as an interlayer insulating film is deposited on the top surfaces of the second insulating film 4 and the second resistance layer 3*b*. The third insulating film 5 may have substantially the same configuration as the second insulating film 4. The third insulating film 5 may include the same material as the second insulating film 4, or may include material different from that included in the second insulating film 4.

A first electrode (also referred to herein as a "top-surface electrode" or a "pad-forming electrode") 8 is deposited on the top surface of the third insulating film 5. The top-surface electrode 8 can be implemented by a stacked film of titanium/titanium nitride (Ti/TiN), aluminum-silicon (Al—Si), and TiN/Ti. Instead of Al—Si, Al or an Al alloy such as Al—Cu—Si or Al—Cu can be used.

The top-surface electrode 8 has a rectangular planar pattern, as illustrated in FIG. 1. The center of the rectangular planar pattern of the top-surface electrode 8 conforms to the center O of the chip. As illustrated in FIG. 1 and FIG. 2, the edge on the right side of the four sides of the top-surface electrode 8 overlaps with the contact part 34 of the second resistance layer 3*b* in the depth direction. The top-surface electrode 8 is electrically connected to the contact part 34 of the second resistance layer 3*b* through vias 9 buried in contact holes 5*a* provided in the third insulating film 5. The vias 9 are in ohmic contact with the contact part 34 of the second resistance layer 3*b* at a low contact resistance.

As illustrated in FIG. 1, the edge on the lower side of the four sides of the top-surface electrode 8 overlaps with a part of the resistance stacked structure 3*x* in the depth direction, and is electrically connected to the resistance stacked structure 3*x* through vias 9*x*. The edge on the left side of the four sides of the top-surface electrode 8 overlaps with a part of the resistance stacked structure 3*y* in the depth direction, and is electrically connected to the resistance stacked structure 3*y* through vias 9*y*. The edge on the upper side of the four sides of the top-surface electrode 8 overlaps with a part of the resistance stacked structure 3*z* in the depth direction, and is electrically connected to the resistance stacked structure 3*z* through vias 9*z*.

The planar patterns of the top-surface electrode 8 and the respective resistance stacked structures 3, 3*x*, 3*y*, and 3*z* have four-fold rotational symmetry about the center O of the chip. This configuration allows the rotation by the angle of 90° or 180° upon the packaging of the semiconductor device according to the first embodiment, so as to facilitate the assembling operations.

A passivation film 7 serving as an insulating film is deposited on the top surfaces of the top-surface electrode 8 and the third insulating film 5. The passivation film 7 can have a stacked structure including an oxide film such as a TEOS film, a $Si_3N_4$ film, and a polyimide film. The passivation film 7 is provided with an opening 7*a*. FIG. 1 omits the illustration of the passivation film 7 and the third insulating film 5, but indicates the opening 7*a* of the passivation film 7 by the dashed and dotted line. The part of the top-surface electrode 8 exposed to the opening 7*a* of the passivation film 7 serves as a pad region to which bonding wires formed of metal such as aluminum (Al) can be connected.

As illustrated in FIG. 2, a second electrode (a bottom-surface electrode) 10 is deposited on the other surface (the bottom surface) of the semiconductor substrate 1. The bottom-surface electrode 10 can be a single-layer film including gold (Au), or a metal film including titanium (Ti), nickel (Ni), and Au sequentially stacked together. The outermost layer of the bottom-surface electrode 10 may be formed of material that can be soldered. The bottom-surface electrode 10 is fixed by soldering to a metal plate, for example.

The semiconductor device according to the first embodiment includes the four resistance stacked structures 3, 3*x*, 3*y*, and 3*z* connected in parallel between the top-surface electrode 8 and the bottom-surface electrode 10 so as to implement an electrical path serving as a resistor between the top-surface electrode 8 and the bottom-surface electrode 10. The resistance value of the semiconductor device according to the first embodiment is determined as appropriate, but may be set in a resistance range of about several ohms Ω to several hundred ohms Ω, for example.

While the semiconductor device according to the first embodiment is illustrated with the case of including the four resistance stacked structures 3, 3*x*, 3*y*, and 3*z*, the number of the resistance stacked structures may be determined as appropriate. The semiconductor device according to the first embodiment may include the two resistance stacked structures 3 and 3*y* instead, for example.

Changing the presence or absence of the vias 9, 9*x*, 9*y*, and 9*z* connected to the resistance stacked structures 3, 3*x*, 3*y*, and 3*z* can selectively and optionally use the resistance stacked structures 3, 3*x*, 3*y*, and 3*z*. When the resistance value of the respective resistance stacked structures 3, 3*x*, 3*y*, and 3*z* is set to 120Ω, and one of the resistance stacked structures 3, 3*x*, 3*y*, and 3*z* is connected for example, the resistance value of the semiconductor device according to the first embodiment is 120Ω. When the four resistance stacked structures 3, 3*x*, 3*y*, and 3*z* are connected in parallel, the resistance value of the semiconductor device according to the first embodiment is 30Ω. The increase or decrease in the number of the resistance stacked structures 3, 3_x_, 3_y_, and 3_z_ connected in parallel can regulate the resistance value of the semiconductor device according to the first embodiment accordingly.

Figure 3:
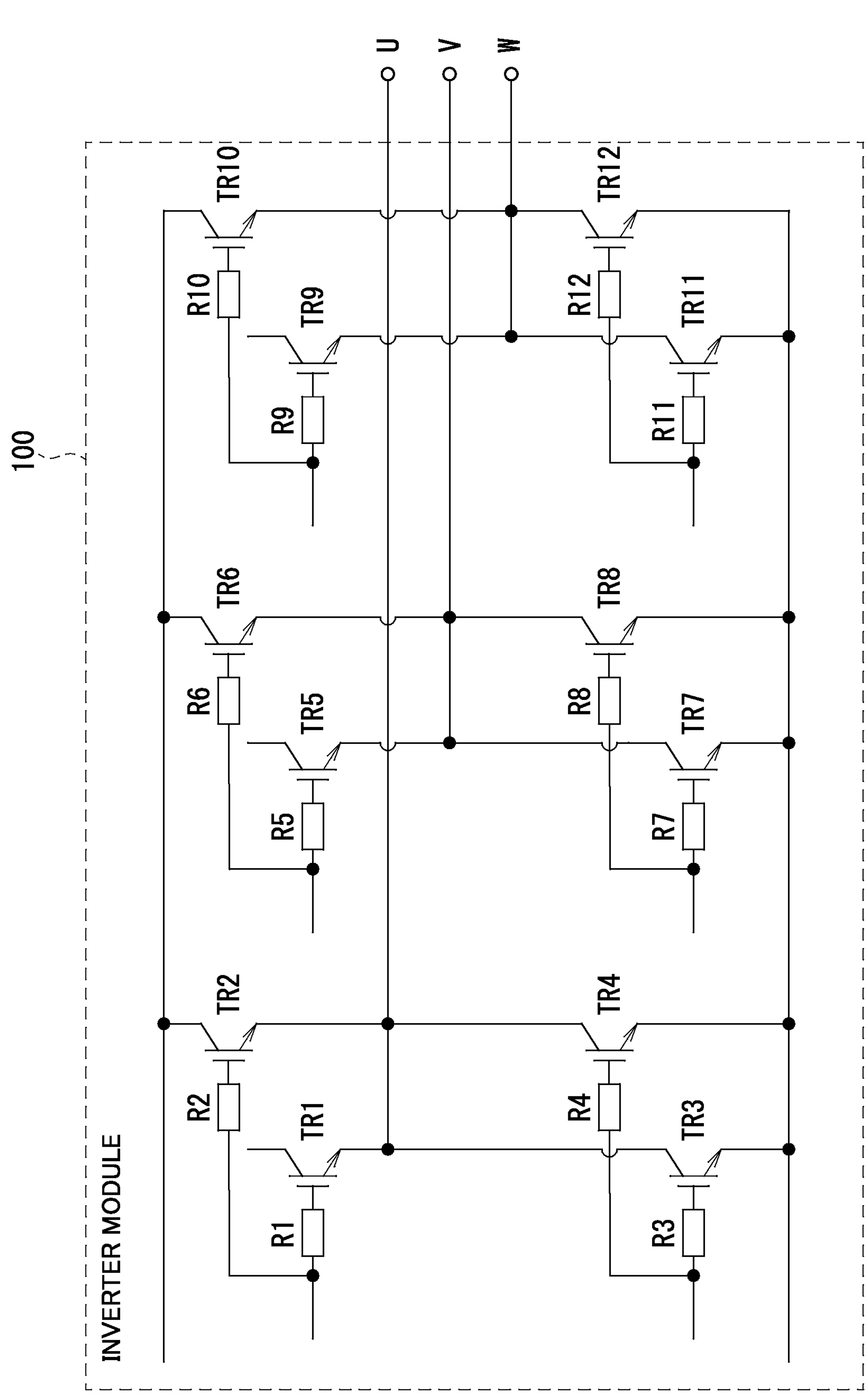
FIG. 3 is a circuit diagram showing an example to which the semiconductor device according to the first embodiment is applied.

The semiconductor device according to the first embodiment can be used for an inverter module 100 that drives a three-phase motor implemented by a u-phase, a v-phase, and a w-phase as illustrated in FIG. 3, for example. The inverter module 100 includes main elements TR1 to TR4 that drive the u-phase, main elements TR5 to TR8 that drive the v-phase, and main elements TR9 to TR12 that drive the w-phase. The main elements TR1 to TR12 are each connected to a freewheeling diode (not illustrated). An IGBT or a MOSFET can be used for the respective main elements TR1 to TR12, for example. To avoid an oscillation phenomenon upon the switching operation, gate resistors R1 to R12 are connected to gate electrodes of the respective main element TR1 to TR12.

The semiconductor device according to the first embodiment can be used for the respective gate resistors R1 to R12. When the semiconductor device according to the first embodiment is used for the gate resistor R1, for example, one side of the gate resistor R1 connected to the gate electrode of the main element TR1 corresponds to the terminal on the top-surface electrode 8 side illustrated in FIG. 1 and FIG. 2. The other side of the gate resistor R1 opposite to the side connected to the gate electrode of the main element TR1 corresponds to the terminal on the bottom-surface electrode 10 side illustrated in FIG. 2.

Comparative Example

Figure 4:
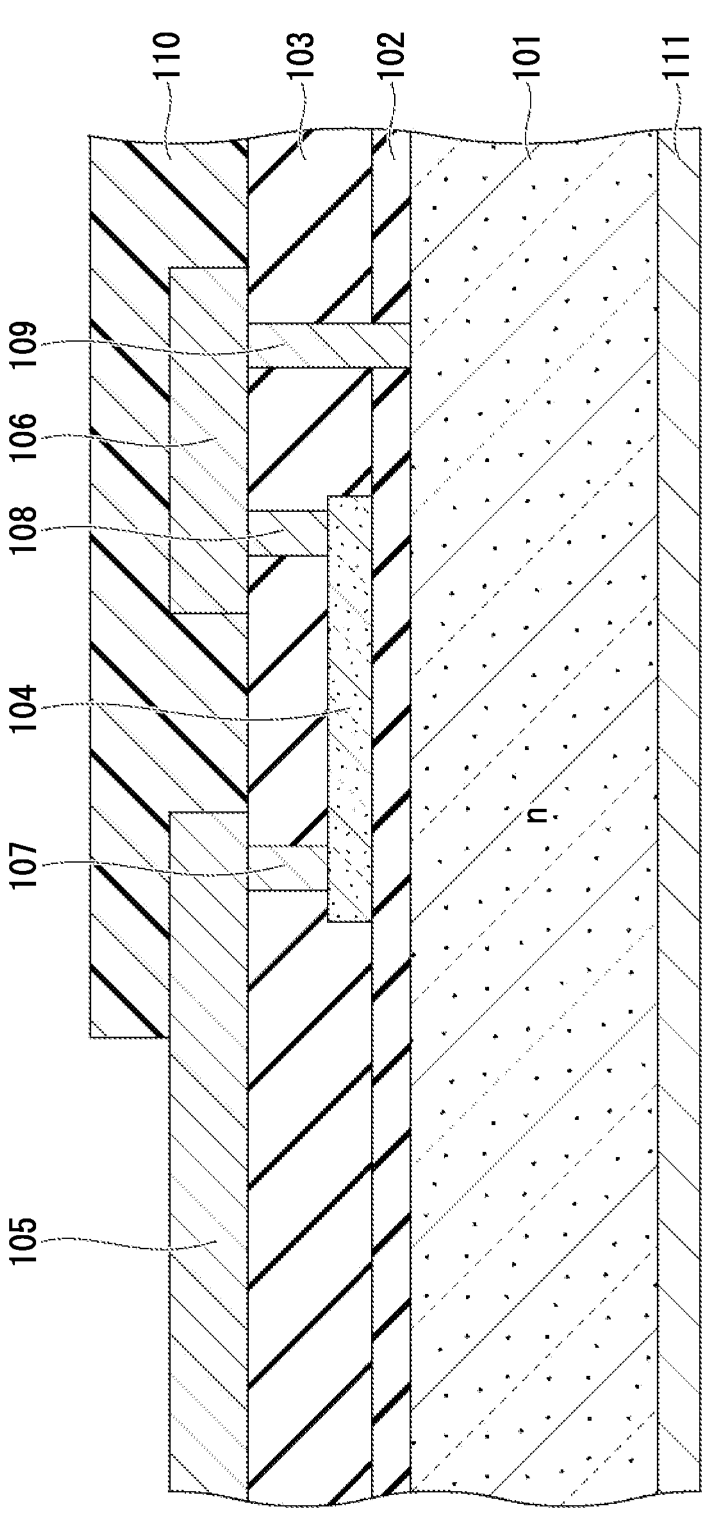
FIG. 4 is a cross-sectional view illustrating a semiconductor device of a comparative example.

A semiconductor device of a comparative example is descried below. As illustrated in FIG. 4, the semiconductor device of the comparative example includes a single resistance layer 104 deposited on a semiconductor substrate 101 via a first insulating film 102. A top-surface electrode 105 is deposited on the resistance layer 104 via a second insulating film 103. The top-surface electrode 105 is electrically connected to one end of the resistance layer 104. A relay wire 106 is provided on the second insulating film 103. The relay wire 106 is electrically connected to the other end of the resistance layer 104. A passivation film 110 is deposited on the top-surface electrode 105 and the relay wire 106. A bottom-surface electrode 111 is provided under the semiconductor substrate 101 so as to be electrically connected to the relay wire 106. The semiconductor device of the comparative example is a resistive element using a region as a resistor between the top-surface electrode 105 and the bottom-surface electrode 111.

If the length of the resistance layer 104 is increased in the semiconductor device of the comparative example in order to increase the resistance value, the chip size is inevitably increased. If the width of the resistance layer 104 is decreased so as to increase the resistance value without the change in the chip size, a variation in the resistance value is inevitably increased.

Figure 5:
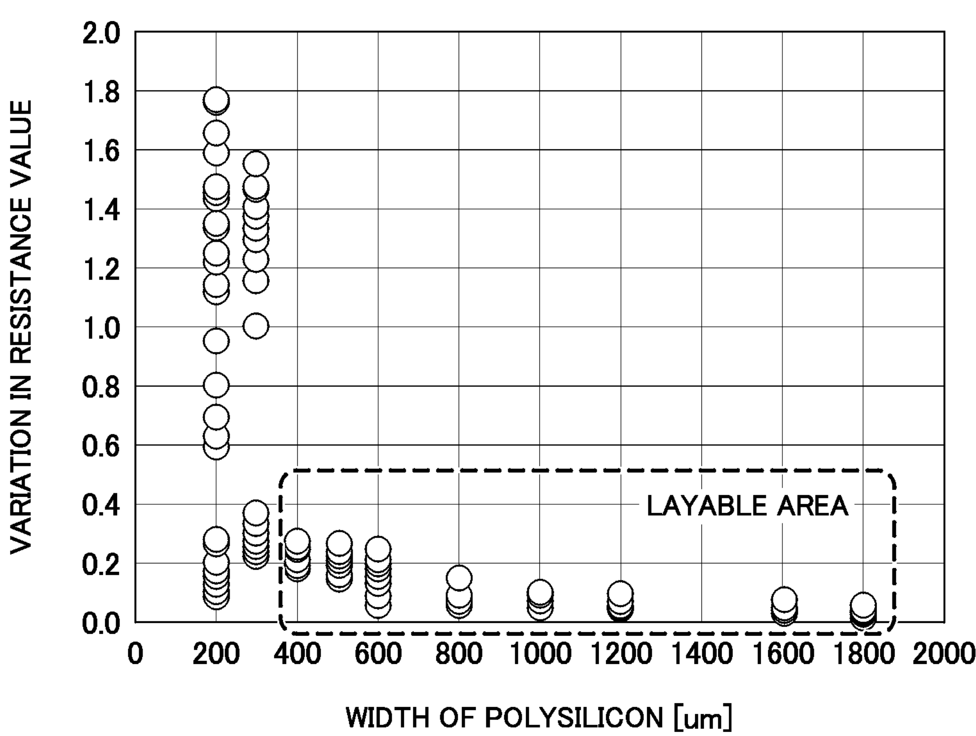
FIG. 5 is a graph showing a polysilicon-width dependency with respect to a variation in resistance value.

FIG. 5 is a graph showing a polysilicon-width dependency with respect to the variation in the resistance value. The axis of abscissas of the graph in FIG. 5 shows a width of polysilicon, and the axis of ordinates of the graph in FIG. 5 shows a standard deviation of the resistance value. The respective points plotted in FIG. 5 are obtained such that the length and the width of the polysilicon are changed while the impurity concentration of the polysilicon keeps constant. As shown in FIG. 5, the variation in the resistance value is remarkably large when the width of the polysilicon is less than 400 micrometers.

In contrast, the semiconductor device according to the first embodiment, which includes the first resistance layer 3_a_ and the second resistance layer 3_b_ stacked together, as illustrated in FIG. 2, can ensure the high resistance without the increase in the chip size. This configuration can adjust the resistance value while leading the width of the first resistance layer 3_a_ and the second resistance layer 3_b_ to be about 400 micrometers or greater, for example, so as to avoid the variation in the respective resistance values of the first resistance layer 3_a_ and the second resistance layer 3_b_ and thus avoid the variation in the resistance value of the entire semiconductor device according to the first embodiment.

Further, the semiconductor device according to the first embodiment, which has the configuration in which the contact part 33 of the first resistance layer 3_a_ has a higher impurity concentration than the body part 32, and the contact part 36 of the second resistance layer 3_b_ has a higher impurity concentration than the body part 35, can lead the first resistance layer 3_a_ and the second resistance layer 3_b_ to be in ohmic contact with each other at a low contact resistance, so as to avoid the variation in the resistance value accordingly.

As described above, the semiconductor device according to the first embodiment has the configuration in which the first resistance layer 3_a_ and the second resistance layer 3_b_ extend to the outside of the outer circumference of the top-surface electrode 8 to be folded back so as to be connected in series. This configuration can avoid damage to the first resistance layer 3_a_ and the second resistance layer 3_b_ when the bonding is executed on the top-surface electrode 8. This configuration can also avoid or decrease a fluctuation of the resistance value of the resistance stacked structure 3 caused by a voltage applied to the top-surface electrode 8. This configuration can further suppress an absorption of hydrogen into titanium (Ti) included in the top-surface electrode 8 during the process of manufacturing the semiconductor device according to the first embodiment, so as to terminate a dangling bond between the first resistance layer 3_a_ and the second resistance layer 3_b_ appropriately.

<Method of Manufacturing Semiconductor Device>

An example of a method of manufacturing the semiconductor device according to the first embodiment is described below. It should be understood that the method of manufacturing the semiconductor device described below is an example, and the semiconductor device can be manufactured by any other methods including modified examples of this embodiment within the scope of the appended claims.

Figure 6:
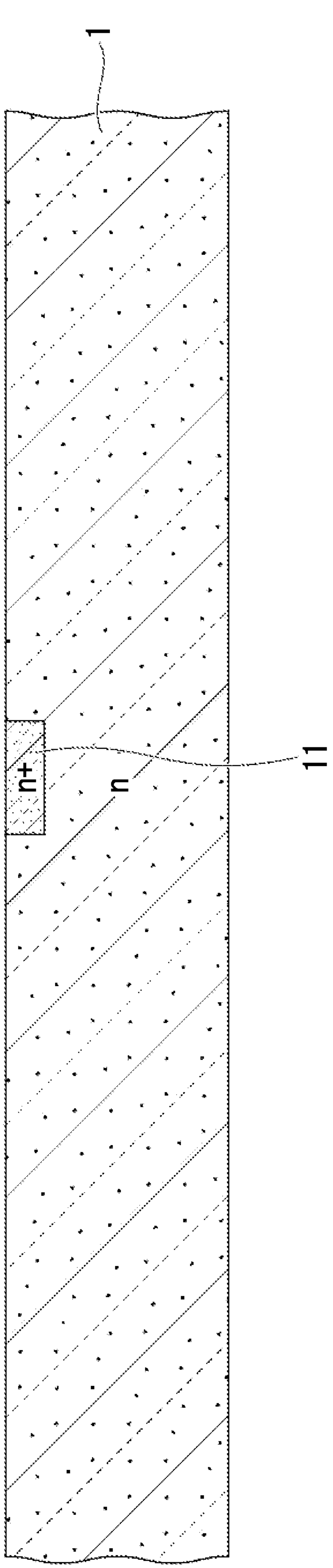
FIG. 6 is a cross-sectional process view illustrating a method of manufacturing the semiconductor device according to the first embodiment.

First, the n-type semiconductor substrate 1 such as a silicon substrate with n-type impurities heavily doped is prepared. Next, a photoresist film is applied on the semiconductor substrate 1, and is then delineated by photolithography. Using the delineated photoresist film as a mask, n-type impurity ions are implanted to the semiconductor substrate 1. The n-type impurity ions are then activated by annealing. The $n^+$-type contact region 11 is thus formed at the upper part of the semiconductor substrate 1, as illustrated in FIG. 6.

Figure 7:
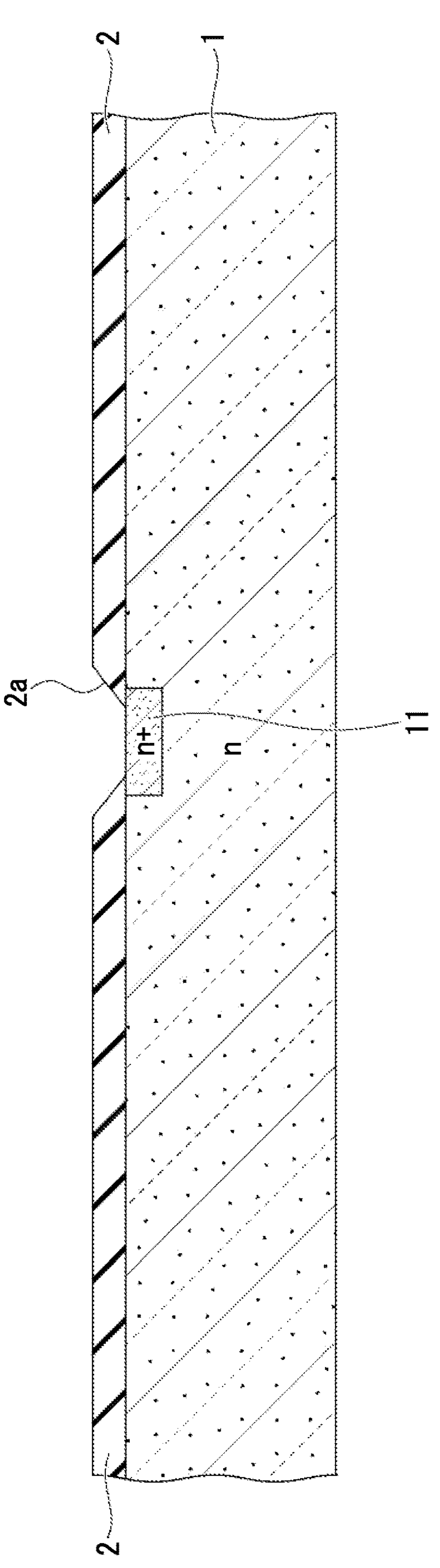
FIG. 7 is a cross-sectional process view continued from FIG. 6, illustrating the method of manufacturing the semiconductor device according to the first embodiment.

Next, the first insulating film 2 is deposited on the semiconductor substrate 1 by a CVD method, for example. The first insulating film 2 may be formed of a composite film obtained such that a thermal oxide film is formed by a thermal oxidation method, and an insulating film is then deposited on the thermal oxide film by the CVD method or the like so as to be stacked together. Next, a photoresist film is applied on the first insulating film 2, and is then delineated by photolithography. Using the delineated photoresist film as a mask for etching, the first insulating film 2 is selectively removed by dry etching such as reactive ion etching (RIE). The photoresist film is then removed. The contact hole 2*a* that leads the contact region 11 to be exposed is thus opened in the first insulating film 2, as illustrated in FIG. 7.

Figure 8:
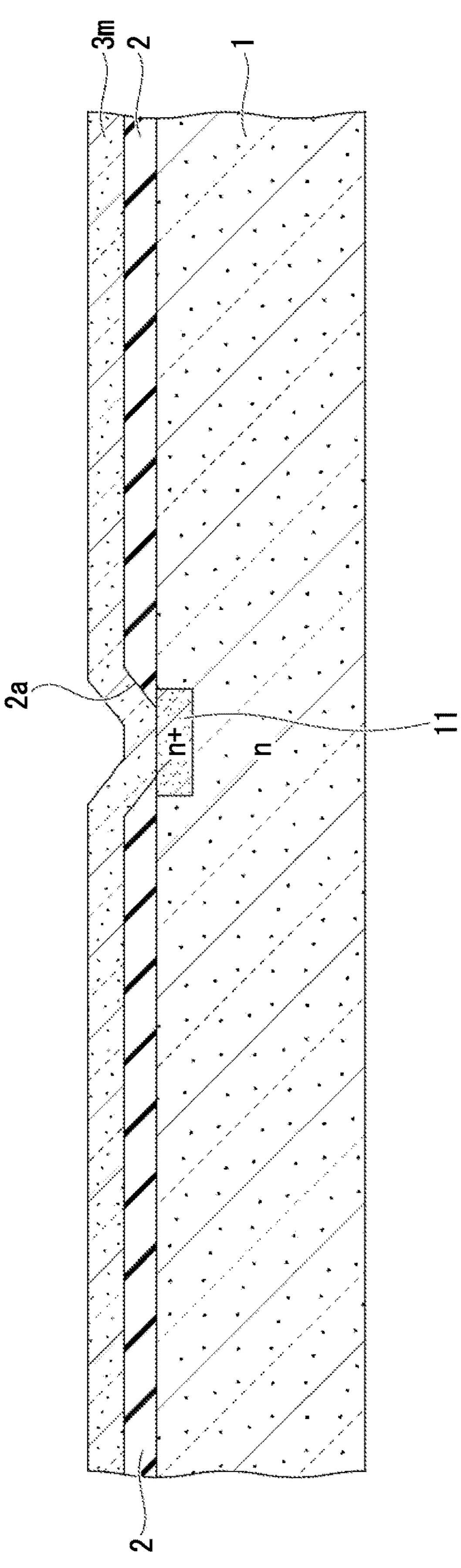
FIG. 8 is a cross-sectional process view continued from FIG. 7, illustrating the method of manufacturing the semiconductor device according to the first embodiment.

Next, a polysilicon layer 3*m* doped with n-type impurities such as phosphorus (P) is formed on the first insulating film 2 by the CVD method or the like, as illustrated in FIG. 8. Alternatively, a non-doped polysilicon layer may be deposited on the first insulating film 2, and n-type impurity ions such as phosphorus (P) may be then implanted so as to form the polysilicon layer 3*m*.

Figure 9:
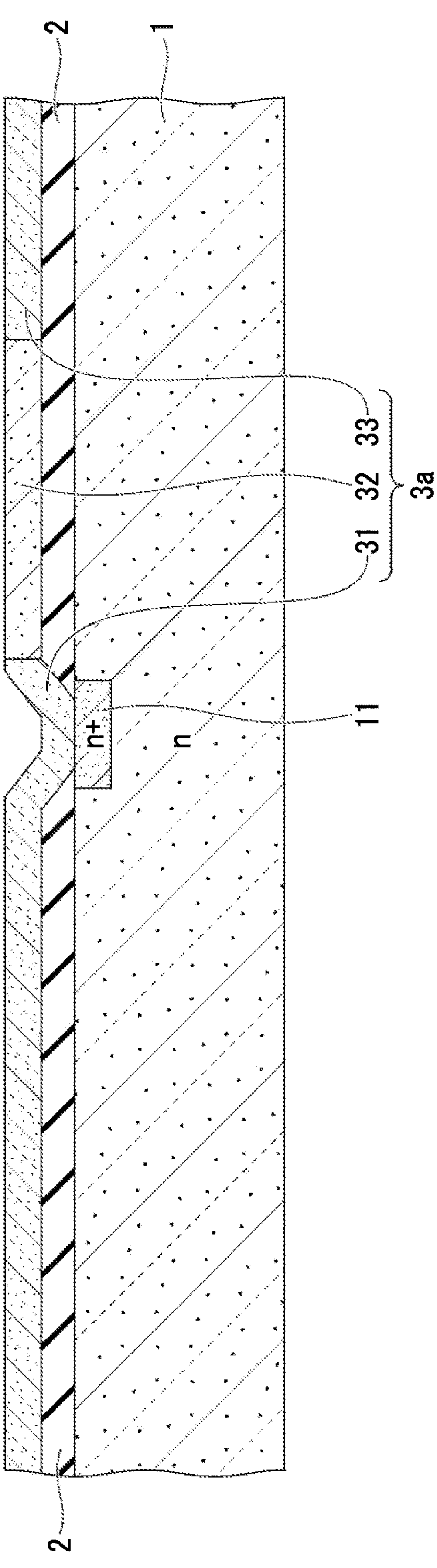
FIG. 9 is a cross-sectional process view continued from FIG. 8, illustrating the method of manufacturing the semiconductor device according to the first embodiment.

Next, a photoresist film is applied on the polysilicon layer 3*m*, and is then delineated by photolithography. Using the delineated photoresist film as a mask, n-type impurity ions such as phosphorus (P) with the dose of about $1\times10^{15}$ $cm^{-2}$ are selectively implanted to the regions that are to serve as the contact part 31 and the contact part 33 of the first resistance layer 3*a*. The n-type impurity ions are then activated by annealing. The contact part 31 and the contact part 33 having a higher impurity concentration than the polysilicon layer 3*m* are thus formed, as illustrated in FIG. 9, so as to lead the polysilicon layer 3*m* interposed between the contact part 31 and the contact part 33 to serve as the body part 32. The first resistance layer 3*a* including the contact part 31, the body part 32, and the contact part 33 is thus provided.

Next, a photoresist film is applied on the first resistance layer 3*a*, and is then delineated by photolithography. Using the delineated photoresist film as a mask for etching, a part of the contact part 31 of the first resistance layer 3*a* on one side toward the center of the chip is selectively removed by the RIE or the like. The photoresist film is then removed.

Figure 10:
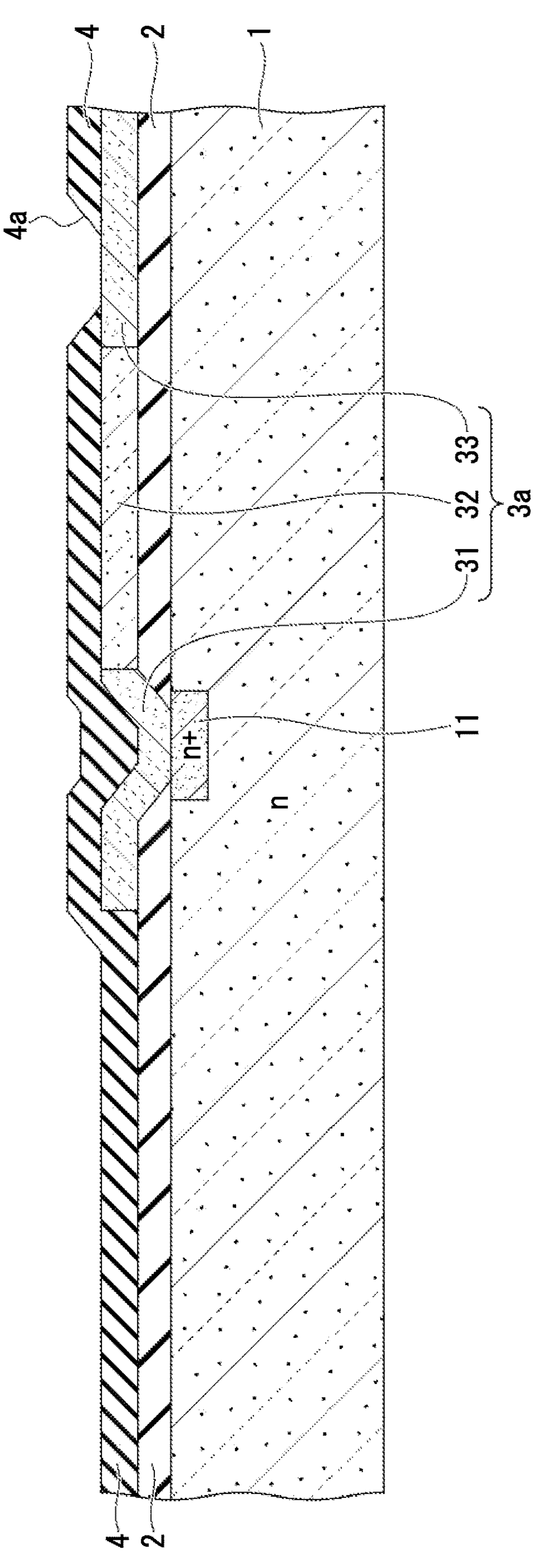
FIG. 10 is a cross-sectional process view continued from FIG. 9, illustrating the method of manufacturing the semiconductor device according to the first embodiment.

Next, the second insulating film 4 is deposited to cover the first insulating film 2 and the first resistance layer 3*a* by the CVD method, for example. A photoresist film is then applied on the second insulating film 4, and is delineated by photolithography. Using the delineated photoresist film as a mask for etching, a part of the second insulating film 4 is selectively removed by the RIE or the like. The photoresist film is then removed. The contact hole 4*a* is thus opened in the second insulating film 4 so as to lead the contact part 33 to be exposed, as illustrated in FIG. 10.

Figure 11:
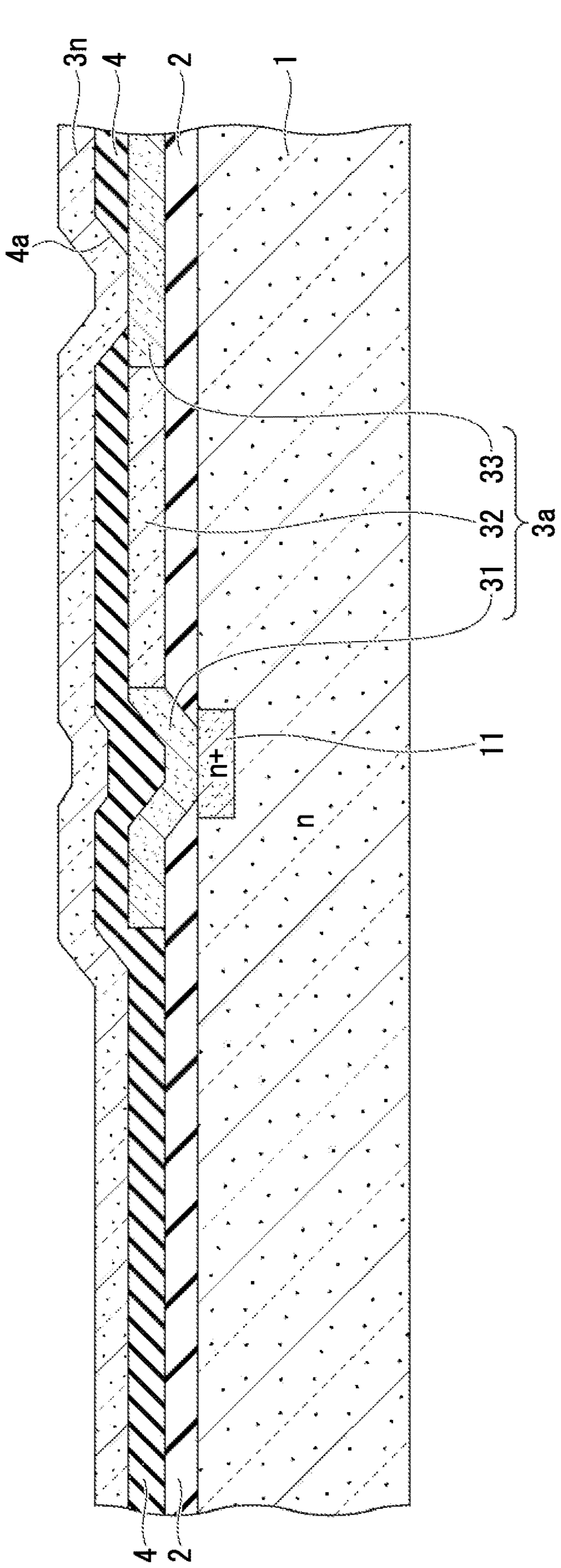
FIG. 11 is a cross-sectional process view continued from FIG. 10, illustrating the method of manufacturing the semiconductor device according to the first embodiment.

Next, a polysilicon layer 3*n* doped with n-type impurities such as phosphorus (P) is formed on the second insulating film 4 by the CVD method or the like, as illustrated in FIG. 11. Alternatively, a non-doped polysilicon layer may be deposited on the second insulating film 4, and n-type impurity ions such as phosphorus (P) may be then implanted so as to form the polysilicon layer 3*n*.

Figure 12:
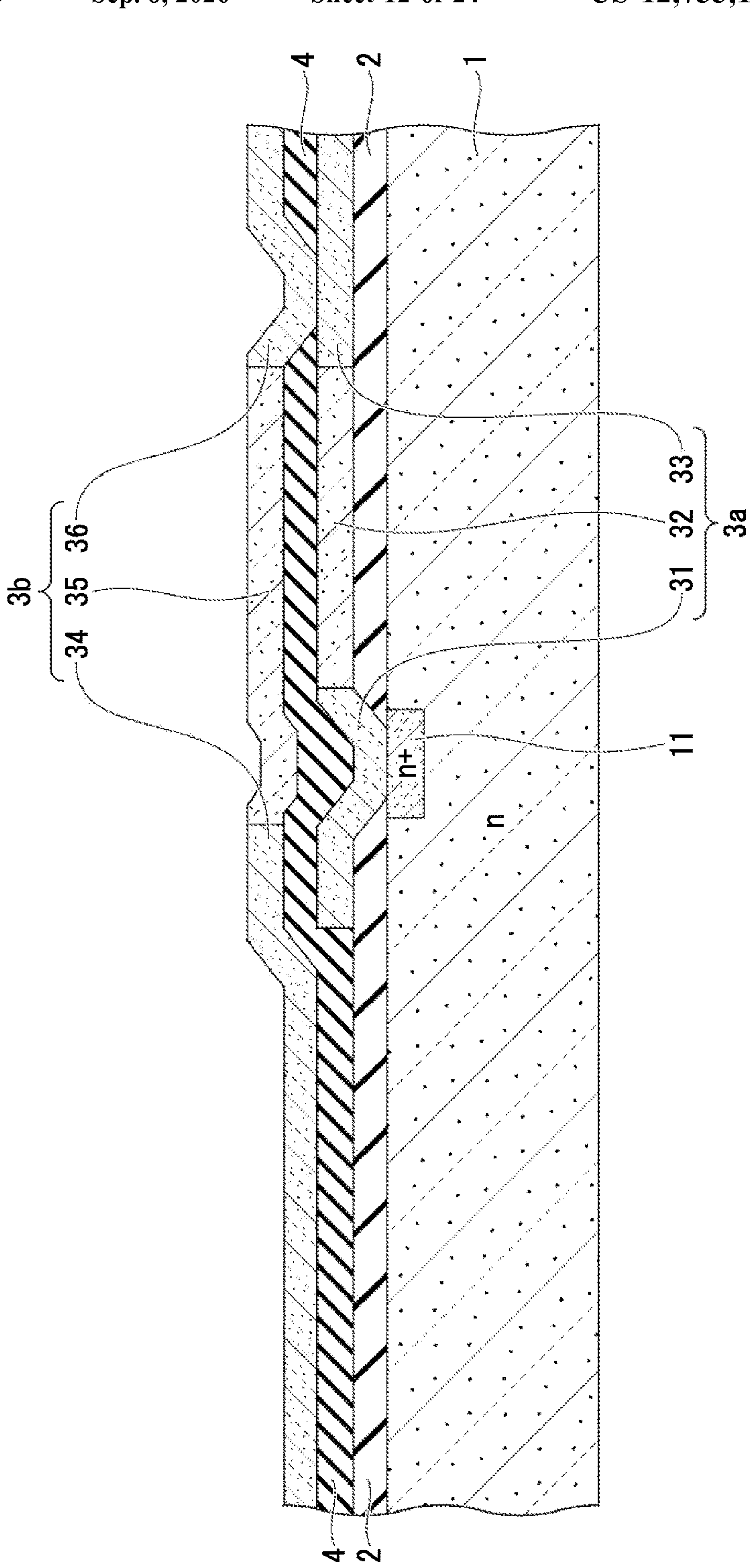
FIG. 12 is a cross-sectional process view continued from FIG. 11, illustrating the method of manufacturing the semiconductor device according to the first embodiment.

Next, a photoresist film is applied on the polysilicon layer 3*n*, and is then delineated by photolithography. Using the delineated photoresist film as a mask, n-type impurity ions such as phosphorus (P) with the dose of about $1\times10^{15}$ $cm^{-2}$ are selectively implanted to the regions that are to serve as the contact part 34 and the contact part 36 of the second resistance layer 3*b*. The n-type impurity ions are then activated by annealing. The contact part 34 and the contact part 36 having a higher impurity concentration than the polysilicon layer 3*n* are thus formed, as illustrated in FIG. 12, so as to lead the polysilicon layer 3*n* interposed between the contact part 34 and the contact part 36 to serve as the body part 35. The second resistance layer 3*b* including the contact part 34, the body part 35, and the contact part 36 is thus provided.

In the case in which the contact part 34, the body part 35, and the contact part 36 of the second resistance layer 3*b* are formed at the positions overlapping with the contact part 31, the body part 32, and the contact part 33 of the first resistance layer 3*a* respectively, the mask for ion implantation for forming the first resistance layer 3*a* can be commonly used for the mask for ion implantation for forming the second resistance layer 3*b*.

Figure 13:
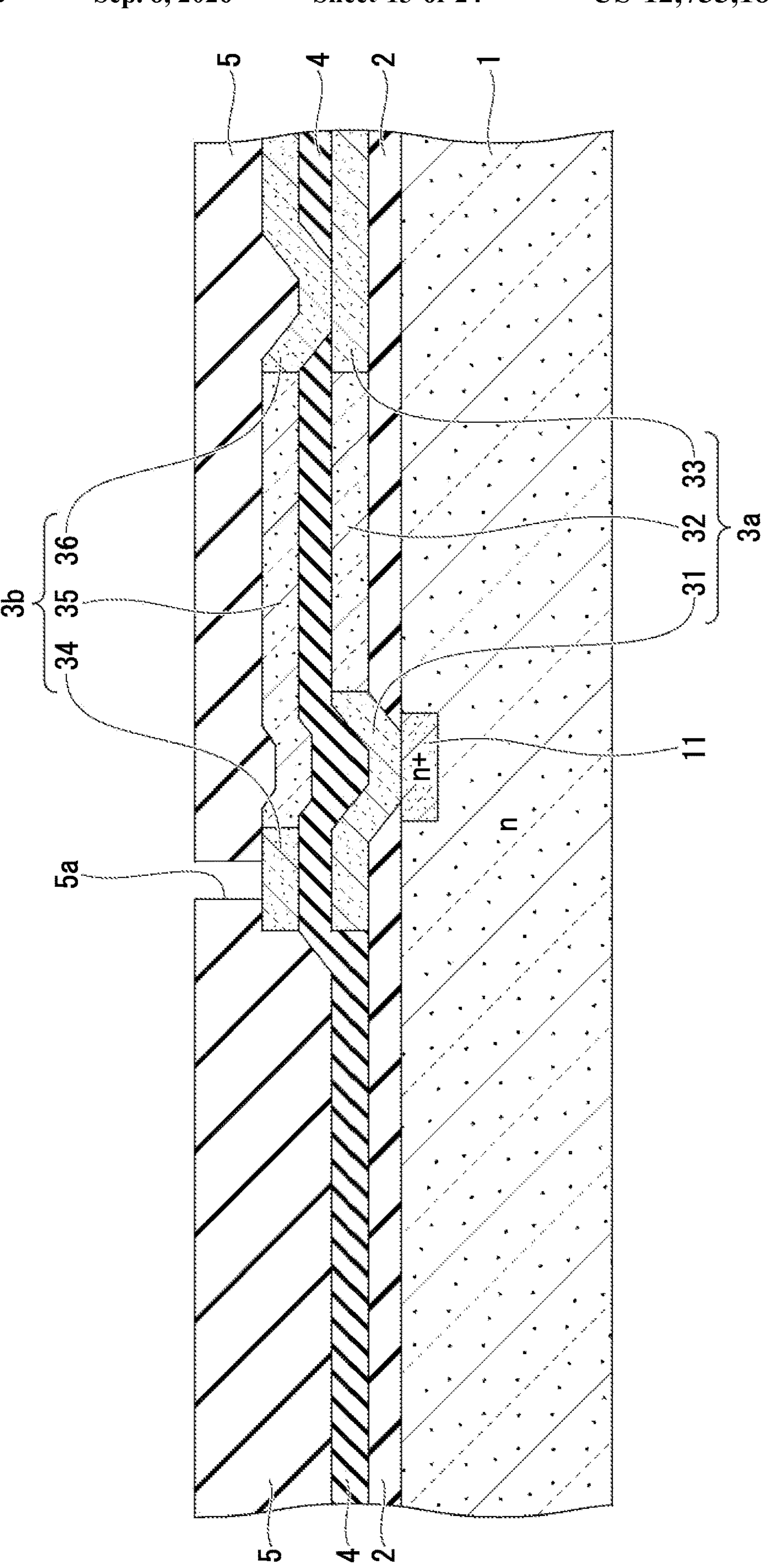
FIG. 13 is a cross-sectional process view continued from FIG. 12, illustrating the method of manufacturing the semiconductor device according to the first embodiment.

Next, the third insulating film 5 is deposited so as to cover the second insulating film 4 and the second resistance layer 3*b* by the CVD method, for example. A photoresist film is then applied on the third insulating film 5, and is then delineated by photolithography. Using the delineated photoresist film as a mask for etching, a part of the third insulating film 5 is selectively removed by the RIE or the like. The photoresist film is then removed. The contact holes 5*a* are thus opened in the third insulating film 5 so as to lead the contact part 34 to be exposed, as illustrated in FIG. 13.

Figure 14:
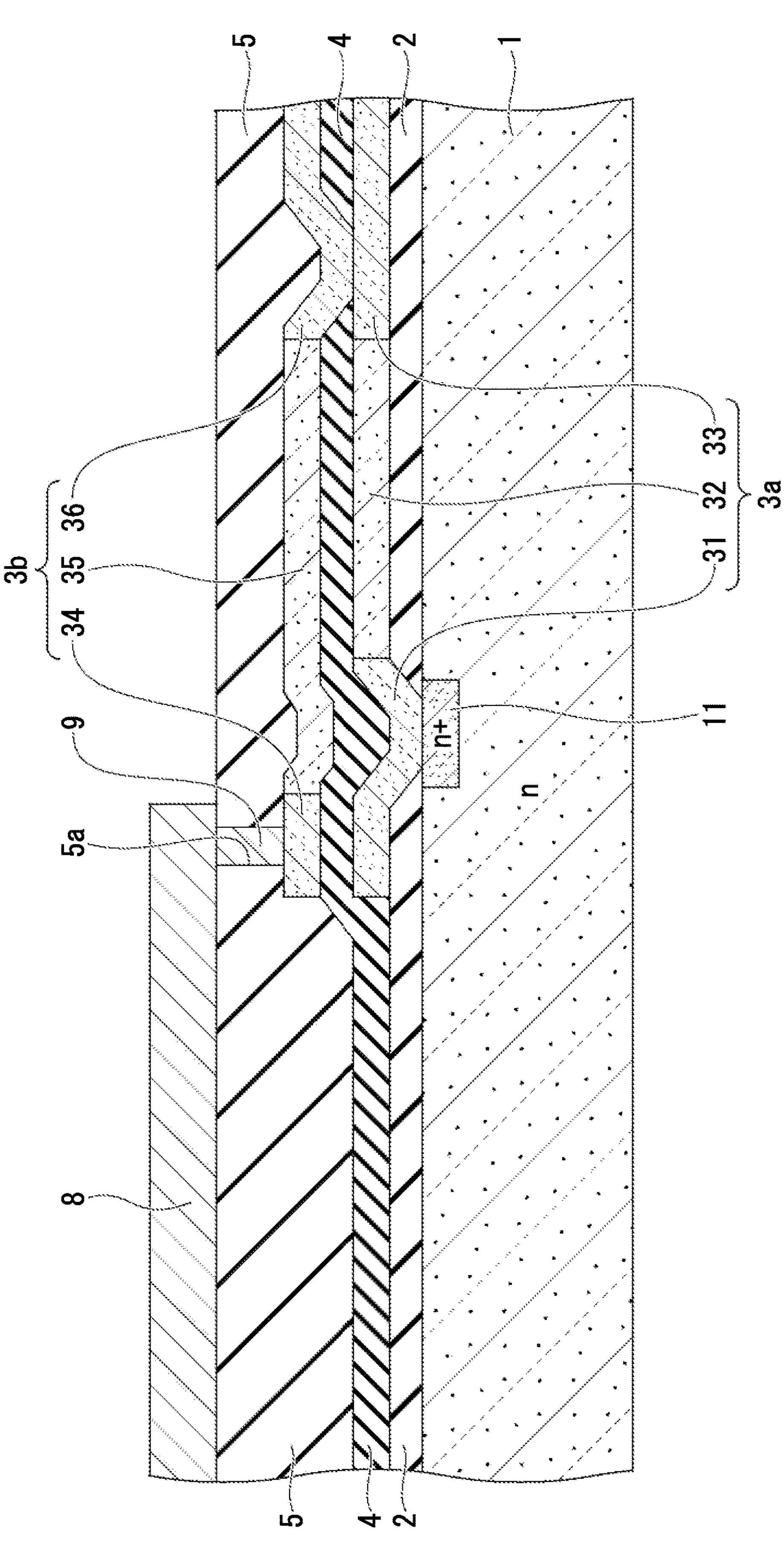
FIG. 14 is a cross-sectional process view continued from FIG. 13, illustrating the method of manufacturing the semiconductor device according to the first embodiment.

Next, a metal film is deposited on the third insulating film 5 by vacuum evaporation or sputtering or the like. The metal film can be formed such that Ti/TiN, Al—Si, and TiN/Ti are stacked in this order by the CVD method, for example. Subsequently, a photoresist film is applied on the metal film, and is then delineated by photolithography. Using the delineated photoresist film as a mask for etching, a part of the metal film is selectively removed. The top-surface electrode 8 is thus formed on the third insulating film 5, and the vias 9 are also buried in the contact holes 5*a*, as illustrated in FIG. 14.

Figure 15:
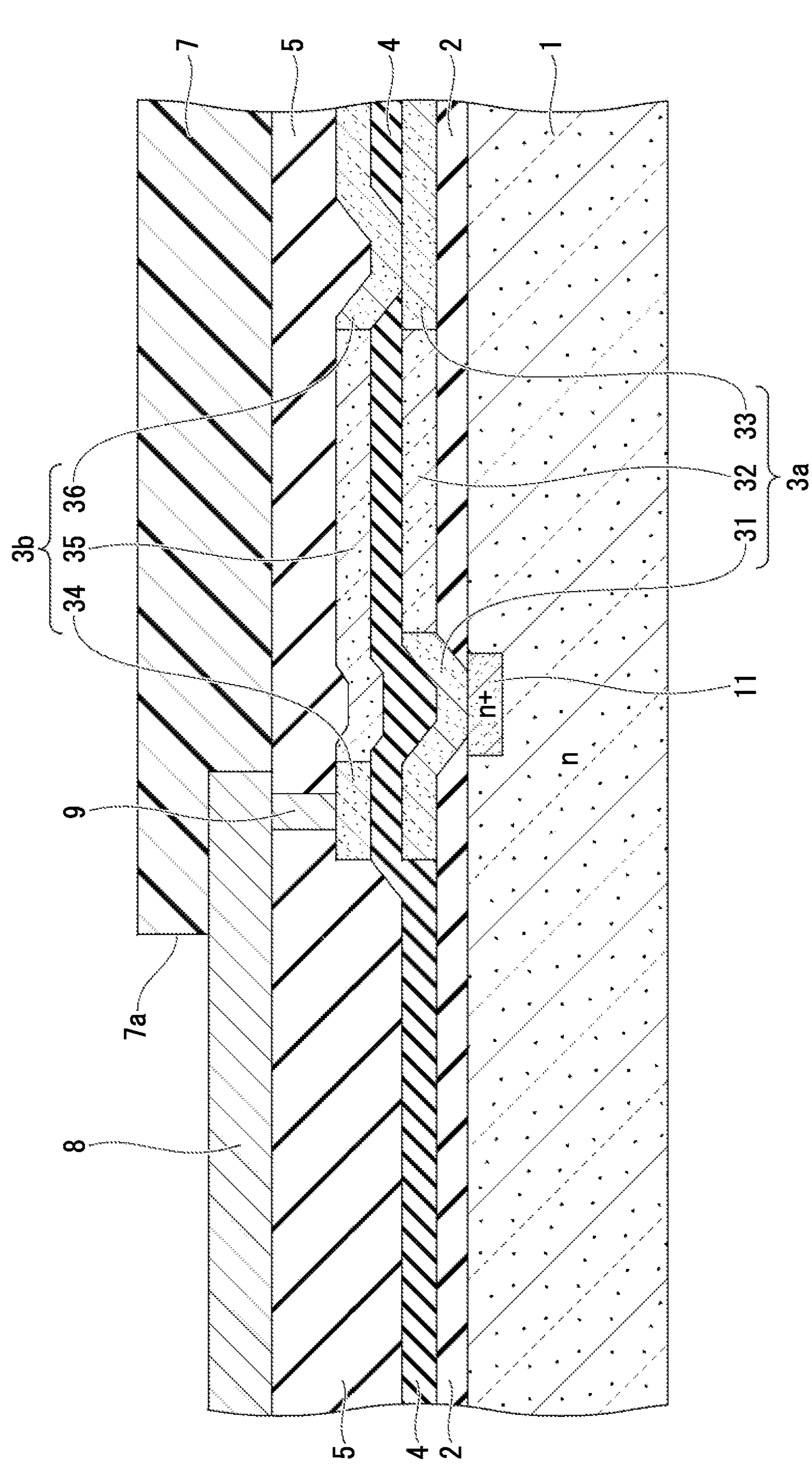
FIG. 15 is a cross-sectional process view continued from FIG. 14, illustrating the method of manufacturing the semiconductor device according to the first embodiment.

Next, the passivation film 7 is formed on the third insulating film 5 and the top-surface electrode 8. The passivation film 7 including a TEOS film, a $Si_3N_4$ film, and a polyimide film is formed such that the TEOS film and the $Si_3N_4$ film are first stacked sequentially by a plasma CVD method or the like, and the polyimide film is further applied on the stacked film, for example. Next, photoresist film is applied on the passivation film 7, and is then delineated by photolithography. Using the delineated photoresist film as a mask for etching, a part of the passivation film 7 is selectively removed. The opening 7*a* is thus formed in the passivation film 7, so as to lead the part of the top-surface electrode 8 exposed to the opening 7*a* to serve as a pad region, as illustrated in FIG. 15.

Next, the bottom surface of the semiconductor substrate 1 is polished by chemical mechanical polishing (CMP), for example, so as to adjust the thickness of the semiconductor substrate 1. Thereafter, the bottom-surface electrode 10 illustrated in FIG. 2 is formed on the bottom surface of the semiconductor substrate 1 by vacuum evaporation or sputtering or the like. The semiconductor device according to the first embodiment is thus completed. A plurality of resistive elements each corresponding to the semiconductor device according to the first embodiment are formed as chip regions into a matrix on a single wafer, and the chip regions are then diced so as to be separated from each other.

Second Embodiment

Figure 16A:
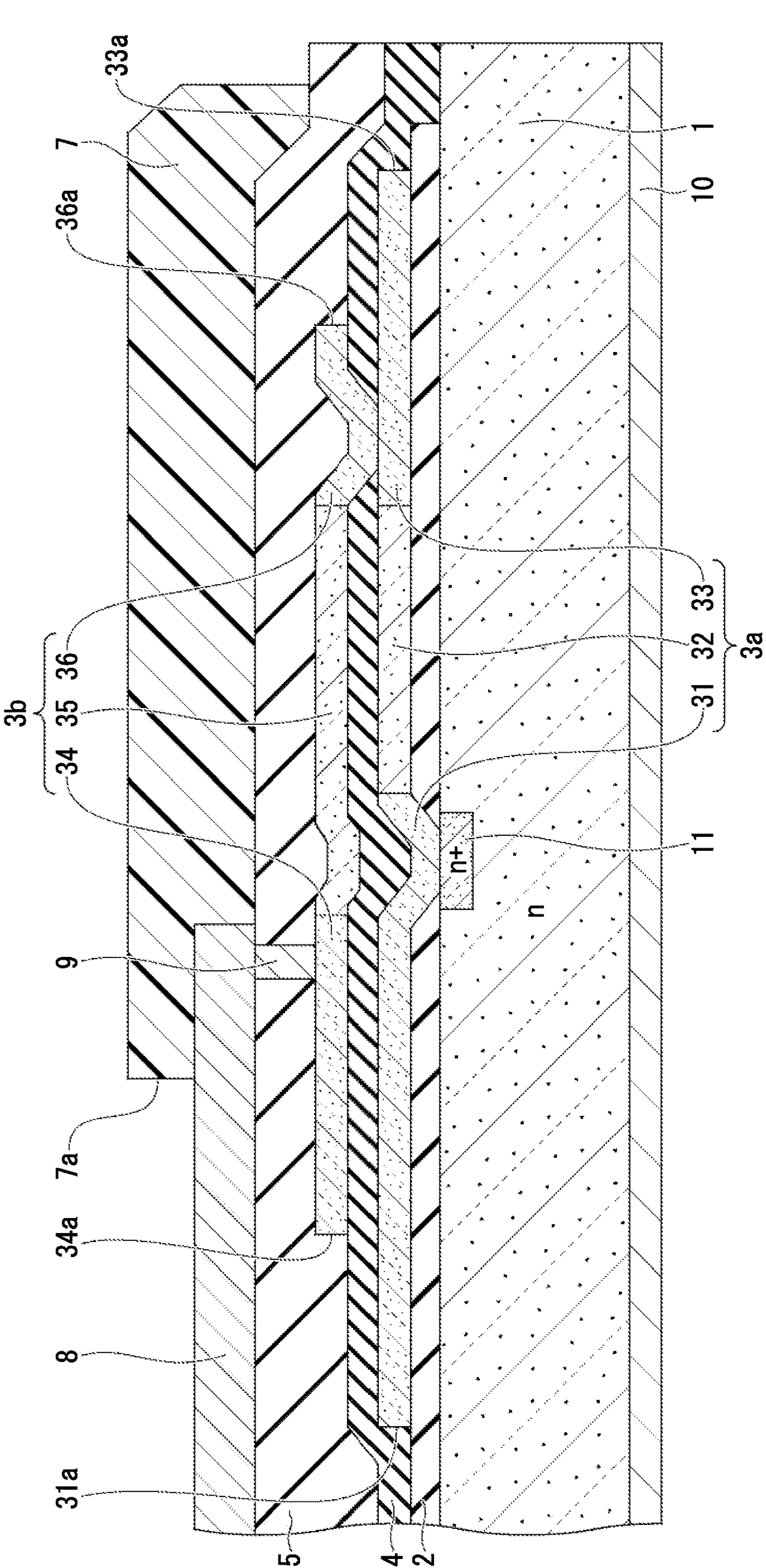
FIG. 16A is a cross-sectional view illustrating a semiconductor device according to a second embodiment.

A planar layout of a semiconductor device according to a second embodiment is common to the planar layout of the semiconductor device according to the first embodiment illustrated in FIG. 1. FIG. 16A is a cross-sectional view of the semiconductor device according to the second embodiment taken along line B-B' in FIG. 1 including the edge of the chip and passing through the resistance stacked structure 3.

The semiconductor device according to the second embodiment differs from the semiconductor device according to the first embodiment in that the contact part 31 of the first resistance layer 3*a* closer to the center of the chip and the contact part 34 of the second resistance layer 3*b* closer to the center of the chip each extend to the inside of the top-surface electrode 8 across the outer circumference, as illustrated in FIG. 16A. The position of the edge 31*a* of the contact part 31 may be either the same as or different from the position of the edge 34*a* of the contact part 34. The position of the edge 33*a* of the contact part 33 of the first resistance layer 3*a* away from the center of the chip may be either the same as or different from the position of the edge 36*a* of the contact part 36 of the second resistance layer 3*b* away from the center of the chip.

Figure 16B:
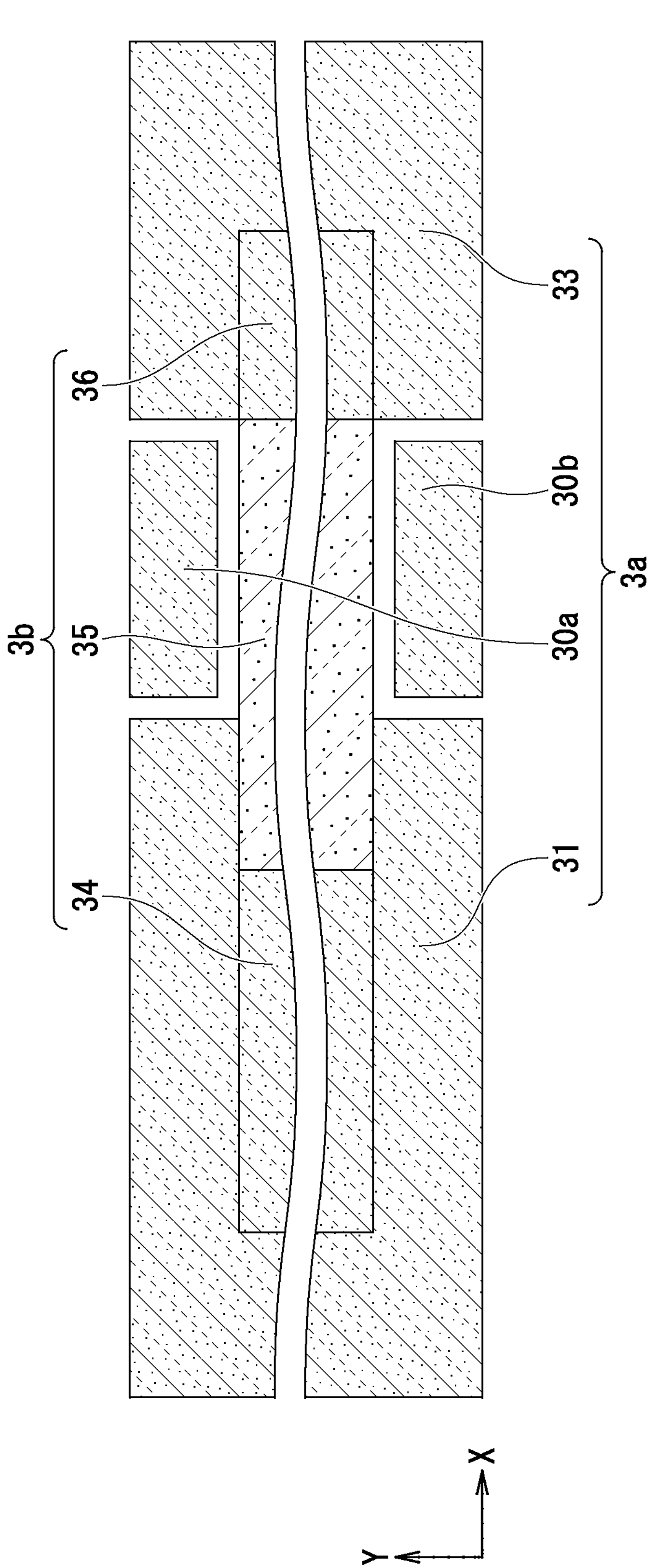
FIG. 16B is a plan view illustrating a part of the semiconductor device according to the second embodiment.

FIG. 16B illustrates a planar pattern including the first resistance layer 3*a* and the second resistance layer 3*b* while omitting the illustration of the other components for brevity. With regard to the rectangular pattern defined by each of the first resistance layer 3*a* and the second resistance layer 3*b*, the edges on the four sides of the first resistance layer 3*a* protrude further than the corresponding edges of the second resistance layer 3*b*. The regions in the first resistance layer 3*a* protruding further than the second resistance layer 3*b* in the X direction are defined by the contact part 31 and the contact part 33 extending in the X direction.

The regions in the first resistance layer 3*a* protruding further than the second resistance layer 3*b* in the Y direction are defined by the contact part 31 and the contact part 33 extending in the Y direction and are also provided with dummy regions 30*a* and 30*b*. The respective dummy regions 30*a* and 30*b* are separated from the protruding parts of the contact part 31 and the contact part 33 by slits. The respective dummy regions 30*a* and 30*b* are also separated from the body part 32 of the first resistance layer 3*a* (refer to FIG. 16A) provided under the body part 35 of the second resistance layer 3*b* by slits. The respective dummy regions 30*a* and 30*b* may be deposited and subjected to ion implantation simultaneously together with the contact part 31 and the contact part 33. The regions in the first resistance layer 3*a* protruding further than the second resistance layer 3*b* in the X direction may be separated from the contact part 31 and the contact part 33 by slits so as to serve as dummy regions. These dummy regions may be formed integrally with the dummy regions 30*a* and 30*b* respectively.

In the case in which the regions in the first resistance layer 3*a* protrude further than the second resistance layer 3*b* in the Y direction, the body part 32 of the first resistance layer 3*a* may extend toward the regions corresponding to the dummy regions 30*a* and 30*b* and the slits, instead of the provision of the dummy regions 30*a* and 30*b*. In such a case, the body part 32 of the first resistance layer 3*a* has a greater width than the body part 35 of the second resistance layer 3*b*. The protruding parts of the body part 32 are connected to the respective protruding parts of the contact part 31 and the contact part 33. Leading the body part 32 to have the protruding parts can expand the adjustment range of the resistance value.

Instead of the configuration illustrated in FIG. 16, the edges on the four sides of the second resistance layer 3*b* may protrude further than the corresponding edges of the first resistance layer 3*a* with regard to the respective rectangular patterns defined by the first resistance layer 3*a* and the second resistance layer 3*b*. In this case, the regions in the second resistance layer 3*b* protruding further than the first resistance layer 3*a* in the X direction may be defined by the contact part 34 and the contact part 36 extending in the X direction.

The regions in the second resistance layer 3*b* protruding further than the first resistance layer 3*a* in the Y direction are defined by the contact part 34 and the contact part 36 extending in the Y direction and are also provided with dummy regions. The respective dummy regions are separated from the protruding parts of the contact part 34 and the contact part 36 by slits. The respective dummy regions are also separated from the body part 35 of the second resistance layer 3*b* by slits. The respective dummy regions may be deposited and subjected to ion implantation simultaneously together with the contact part 34 and the contact part 36.

In the case in which the regions in the second resistance layer 3*b* protrude further than the first resistance layer 3*a* in the Y direction, the body part 35 of the second resistance layer 3*b* may extend toward the regions corresponding to the dummy regions and the slits, instead of the provision of the dummy regions. In such a case, the body part 35 of the second resistance layer 3*b* has a greater width than the body part 32 of the first resistance layer 3*a*. The protruding parts of the body part 35 are connected to the respective protruding parts of the contact part 34 and the contact part 36. Leading the body part 35 to have the protruding parts can expand the adjustment range of the resistance value. The other configurations of the semiconductor device according to the second embodiment are the same as those of the semiconductor device according to the first embodiment, and overlapping explanations are not repeated below.

The semiconductor device according to the second embodiment including the first resistance layer 3*a* and the second resistance layer 3*b* stacked together can also adjust the resistance value without the change in the chip size, and avoid the variation in the resistance value accordingly.

Further, the semiconductor device according to the second embodiment having the configuration regarding the positional differences between the first resistance layer 3*a* and the second resistance layer 3*b*, in which the position of the edge 31*a* of the first resistance layer 3*a* closer to the center of the chip is different from the position of the edge 34*a* of the second resistance layer 3*b* closer to the center of the chip, can lead the third insulating film 5 and the pad region of the top-surface electrode 8 to be flattened, as compared with the case in which the respective edges of the first resistance layer 3*a* and the second resistance layer 3*b* conform to each other. In addition, the semiconductor device according to the second embodiment having the configuration regarding the positional differences between the first resistance layer 3*a* and the second resistance layer 3*b*, in which the position of the edge 33*a* of the first resistance layer 3*a* away from the center of the chip is different from the position of the edge 36*a* of the second resistance layer 3*b* away from the center of the chip, can improve the covering performance of the third insulating film 5 and the passivation film 7 on the first resistance layer 3*a* and the second resistance layer 3*b*, as compared with the case in which the respective edges of the first resistance layer 3*a* and the second resistance layer 3*b* conform to each other.

Third Embodiment

Figure 17:
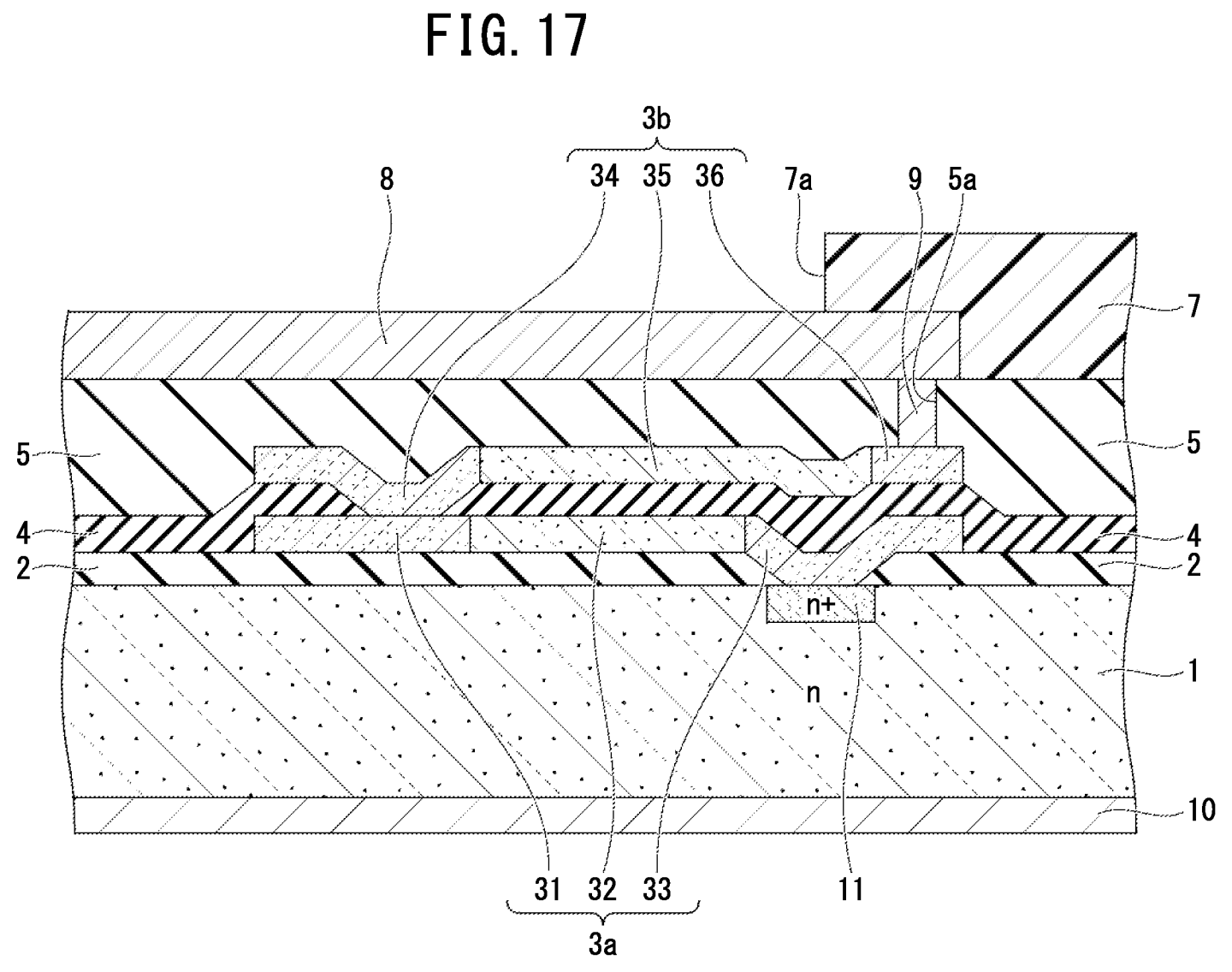

A semiconductor device according to a third embodiment differs from the semiconductor device according to the first embodiment in that the first resistance layer 3*a* and the second resistance layer 3*b* are deposited to be folded back inside the outer circumference of the top-surface electrode 8 toward the center of the chip, as illustrated in FIG. 17.

The contact part 33 of the first resistance layer 3*a* away from the center of the chip is in ohmic contact with the contact region 11 at a low contact resistance. The contact part 31 of the first resistance layer 3*a* closer to the center of the chip is in ohmic contact with the contact part 34 of the second resistance layer 3*b* closer to the center of the chip at a low contact resistance. The contact part 36 of the second resistance layer 3*b* away from the center of the chip is in ohmic contact with the vias 9 at a low contact resistance. The other configurations of the semiconductor device according to the third embodiment are the same as those of the semiconductor device according to the first embodiment, and overlapping explanations are not repeated below.

The semiconductor device according to the third embodiment including the first resistance layer 3*a* and the second resistance layer 3*b* stacked together can also adjust the resistance value without the change in the chip size, and avoid the variation in the resistance value accordingly. Further, the third embodiment with the configuration in which the first resistance layer 3*a* and the second resistance layer 3*b* are provided to be folded back toward the center of the chip can achieve a reduction in size more than the semiconductor device according to the first embodiment.

Fourth Embodiment

Figure 18:
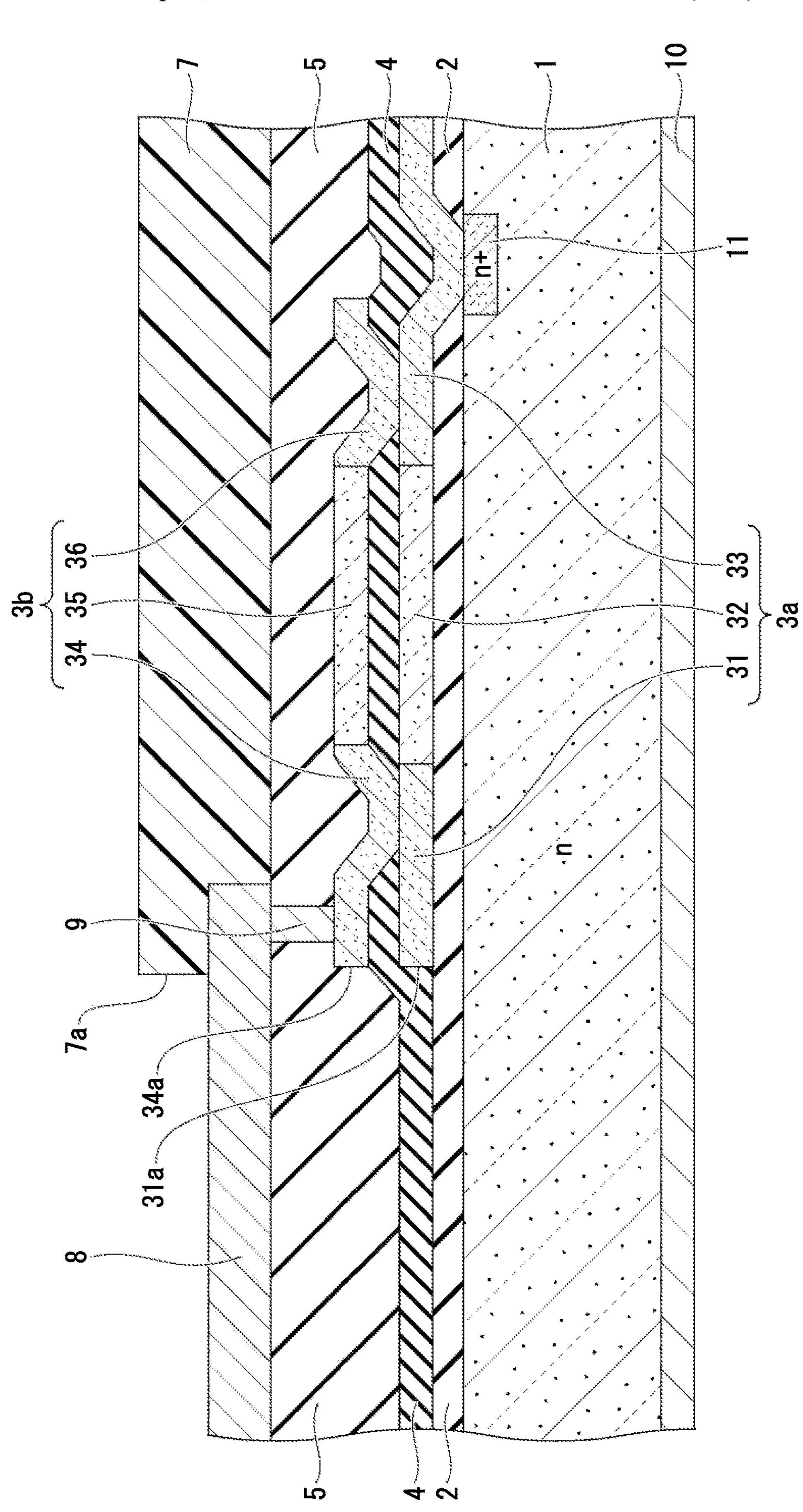
FIG. 18 is a cross-sectional view illustrating a semiconductor device according to a fourth embodiment.

A semiconductor device according to a fourth embodiment differs from the semiconductor device according to the first embodiment in that the first resistance layer 3*a* and the second resistance layer 3*b* are connected in parallel, as illustrated in FIG. 18. The contact part 31 of the first resistance layer 3*a* closer to the center of the chip is in ohmic contact with the contact part 34 of the second resistance layer 3*b* closer to the center of the chip at a low contact resistance. The contact part 33 of the first resistance layer 3*a* away from the center of the chip is in ohmic contact with the contact region 36 of the second resistance layer 3*b* away from the center of the chip at a low contact resistance. The other configurations of the semiconductor device according to the fourth embodiment are the same as those of the semiconductor device according to the first embodiment, and overlapping explanations are not repeated below.

The semiconductor device according to the fourth embodiment including the first resistance layer 3*a* and the second resistance layer 3*b* stacked together can also adjust the resistance value without the change in the chip size, and avoid the variation in the resistance value accordingly. Further, the fourth embodiment with the configuration in which the first resistance layer 3*a* and the second resistance layer 3*b* are connected in parallel can further expand the flexibility of the resistance value to be adjusted. While the fourth embodiment is illustrated with the case of including the two resistance layers stacked together, three or more resistance layers may be stacked together and connected in parallel with each other.

Fifth Embodiment

Figure 19:
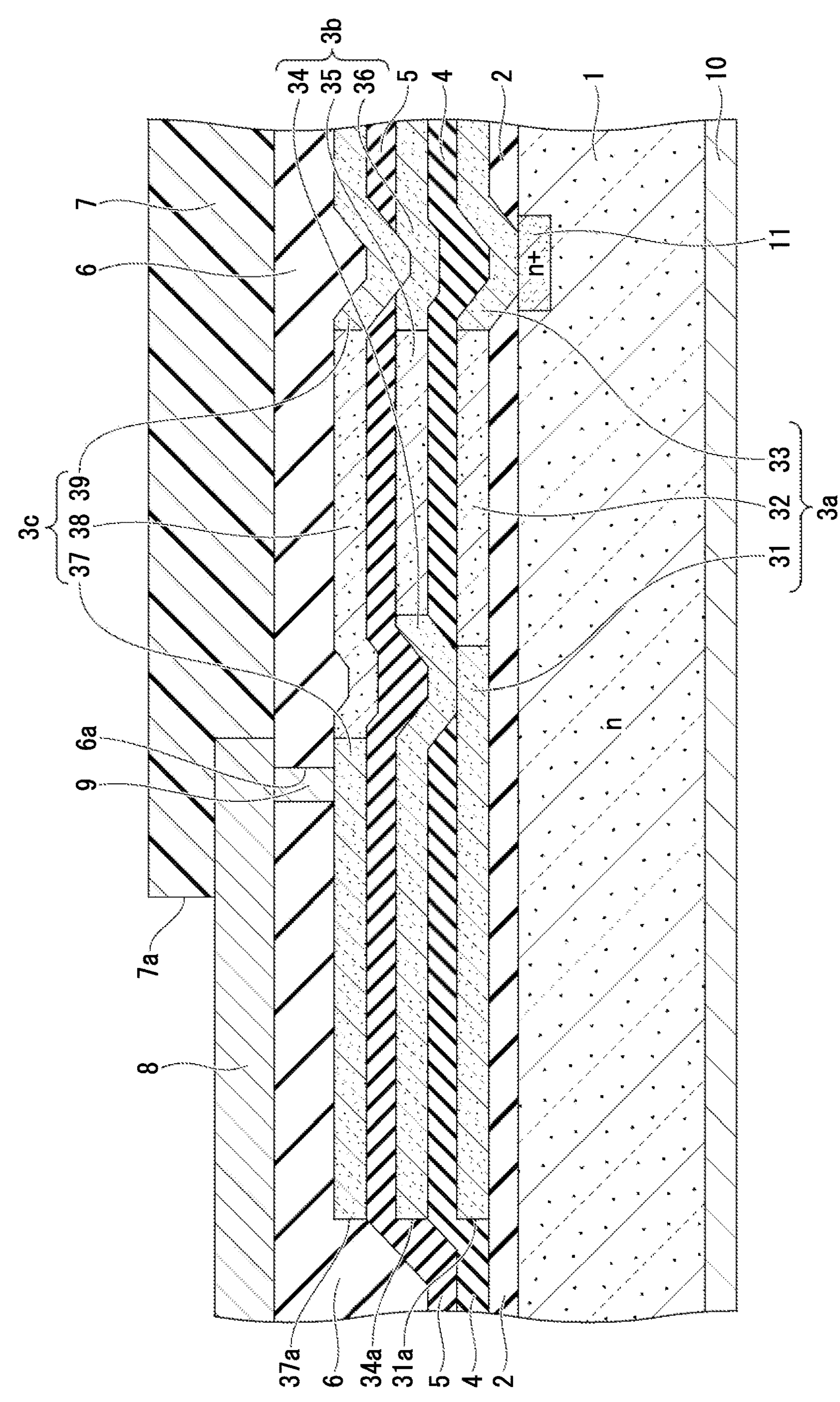
FIG. 19 is a cross-sectional view illustrating a semiconductor device according to a fifth embodiment.

A semiconductor device according to a fifth embodiment differs from the semiconductor device according to the first embodiment in including three resistance layers of the first resistance layer 3*a*, the second resistance layer 3*b*, and a third resistance layer 3*c* stacked together, as illustrated in FIG. 19. The first resistance layer 3*a*, the second resistance layer 3*b*, and the third resistance layer 3*c* are connected in series. The third resistance layer 3*c* includes polysilicon as in the case of the first resistance layer 3*a* and the second resistance layer 3*b*. A fourth insulating film 6 is deposited on the respective top surfaces of the third resistance layer 3*c* and the third insulating film 5. The top-surface electrode 8 is deposited on the fourth insulating film 6.

The first resistance layer 3*a* includes the body part 32, the contact part 31 provided on one side of the body part 32 closer to the center of the chip and having a higher impurity concentration than the body part 32, and the contact part 33 provided on the other side of the body part 32 away from the center of the chip and having a higher impurity concentration than the body part 32. The contact part 33 is in ohmic contact with the contact part 11 provided at the upper part of the semiconductor substrate 1 at a low contact resistance.

The second resistance layer 3*b* includes the body part 35, the contact part 34 provided on one side of the body part 35 closer to the center of the chip and having a higher impurity concentration than the body part 35, and the contact part 36 provided on the other side of the body part 35 away from the center of the chip and having a higher impurity concentration than the body part 35. The contact part 34 is in ohmic contact with the contact part 31 of the first resistance layer 3*a* at a low contact resistance.

The third resistance layer 3*c* includes a body part 38, a contact part 37 provided on one side of the body part 38 closer to the center of the chip and having a higher impurity concentration than the body part 38, and a contact part 39 provided on the other side of the body part 38 away from the center of the chip and having a higher impurity concentration than the body part 38. The contact part 39 is in ohmic contact with the contact part 36 of the second resistance layer 3*b* at a low contact resistance. The contact part 37 is electrically connected to the top-surface electrode 8 through the vias 9 buried in the contact holes 6*a* provided in the fourth insulating film 6. The top-surface electrode 8 is electrically connected to the second resistance layer 3*b* via the third resistance layer 3*c*. The other configurations of the semiconductor device according to the fifth embodiment are the same as those of the semiconductor device according to the first embodiment, and overlapping explanations are not repeated below.

The semiconductor device according to the fifth embodiment, which includes the three resistance layers of the first resistance layer 3*a*, the second resistance layer 3*b*, and the third resistance layer 3*c* stacked together, can also adjust the resistance value without the change in the chip size, and avoid the variation in the resistance value accordingly. Further, the fifth embodiment with the configuration of including the three resistance layers stacked together can further expand the flexibility of the resistance value to be adjusted. While the fifth embodiment is illustrated with the case of including the three resistance layers stacked together, four or more resistance layers may be stacked together and connected in parallel with each other.

Sixth Embodiment

Figure 20:
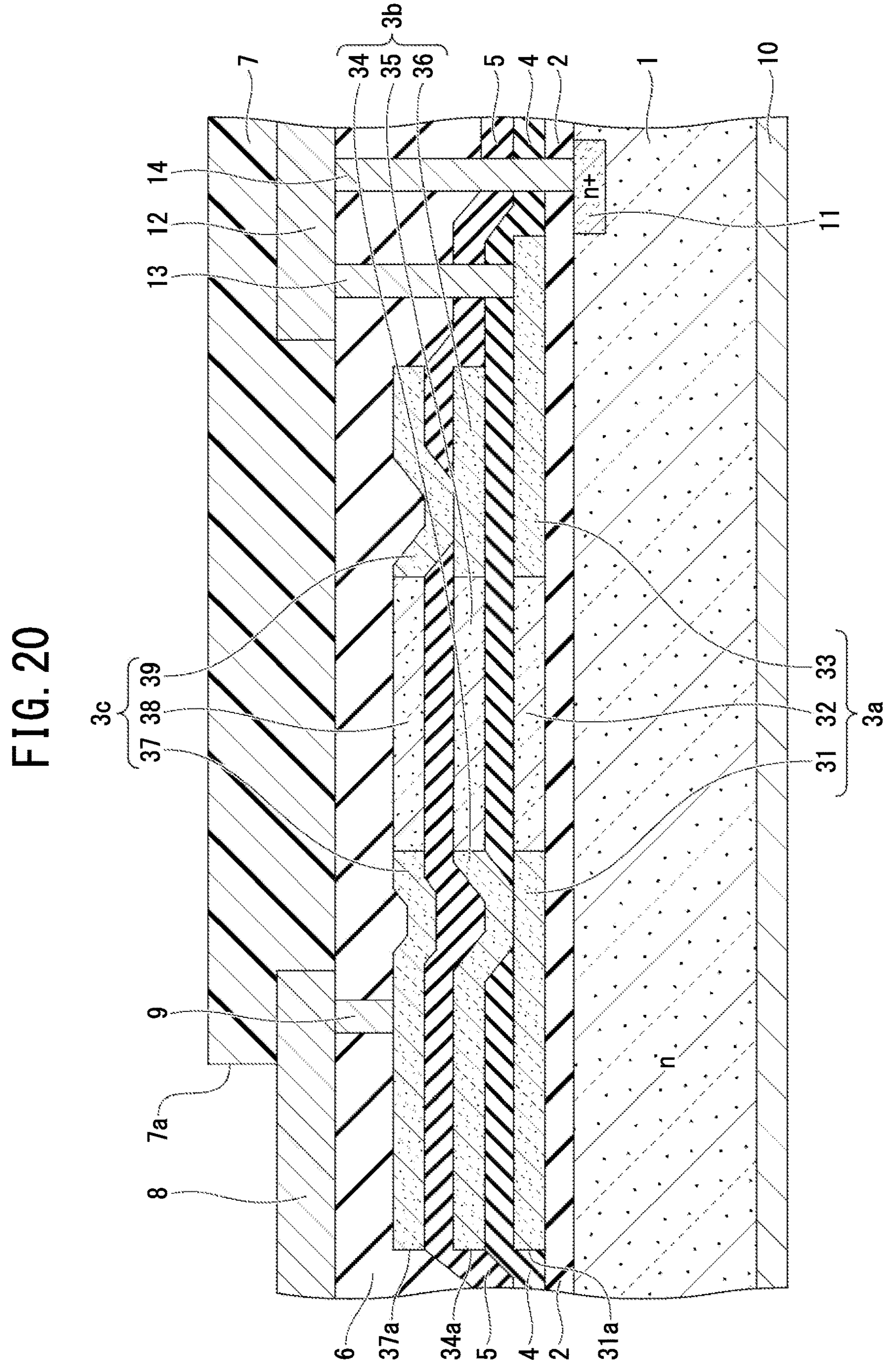
FIG. 20 is a cross-sectional view illustrating a semiconductor device according to a sixth embodiment.

A semiconductor device according to a sixth embodiment has the same configuration as the fifth embodiment in including the three resistance layers of the first resistance layer 3*a*, the second resistance layer 3*b*, and the third resistance layer 3*c* stacked together, as illustrated in FIG. 20. The semiconductor device according to the sixth embodiment differs from the semiconductor device according to the fifth embodiment in that the contact part 33 of the first resistance layer 3*a* is electrically connected to the contact region 11 through a via 13, a relay wire 12, and a via 14.

The relay wire 12 can be formed from the same material as the top-surface electrode 8. The via 13 and the via 14 may each be a stacked via. The via 13 is in ohmic contact with the contact part 33 of the first resistance layer 3*a* at a low contact resistance. The via 14 is in ohmic contact with the contact region 11 at a low contact resistance. The other configurations of the semiconductor device according to the sixth embodiment are the same as those of the semiconductor device according to the fifth embodiment, and overlapping explanations are not repeated below.

The semiconductor device according to the sixth embodiment, in which the contact part 33 of the first resistance layer 3*a* is electrically connected to the contact region 11 through the via 13, the relay wire 12, and the via 14, can also adjust the resistance value without the change in the chip size, and also avoid the variation in the resistance value due to the three resistance layers of the first resistance layer 3*a*, the second resistance layer 3*b*, and the third resistance layer 3*c* stacked together.

Seventh Embodiment

Figure 21:
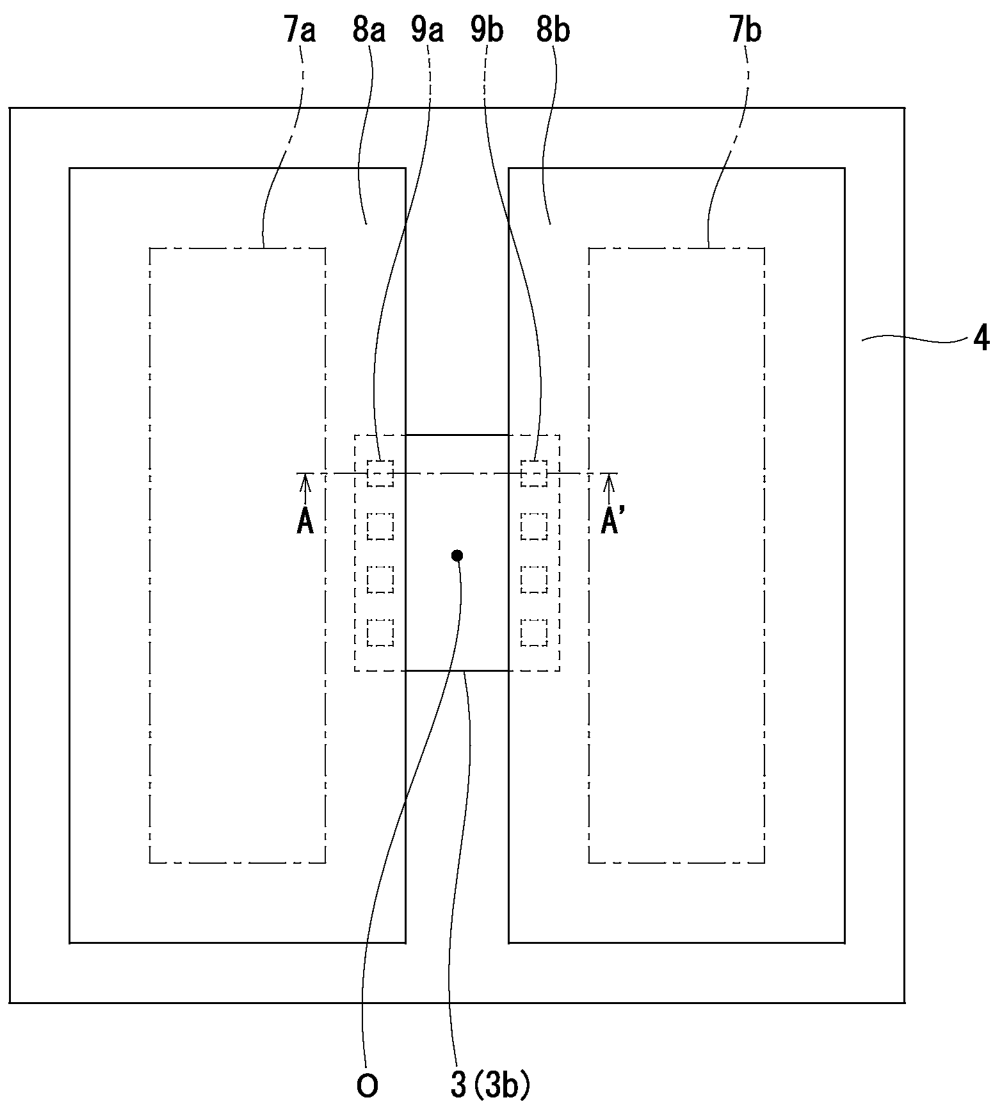
FIG. 21 is a plan view illustrating a semiconductor device according to a seventh embodiment.

A semiconductor device according to a seventh embodiment differs from the semiconductor device according to the first embodiment in being used as a horizontal resistive element including a first electrode (a top-surface electrode) 8*a* and a second electrode (a top-surface electrode) 8*b* on the top surface side, as illustrated in FIG. 21. The top-surface electrodes 8*a* and 8*b* are provided separately from each other about the center O of the chip. The resistance stacked structure 3 is provided between the respective top-surface electrodes 8*a* and 8*b*.

Figure 22:
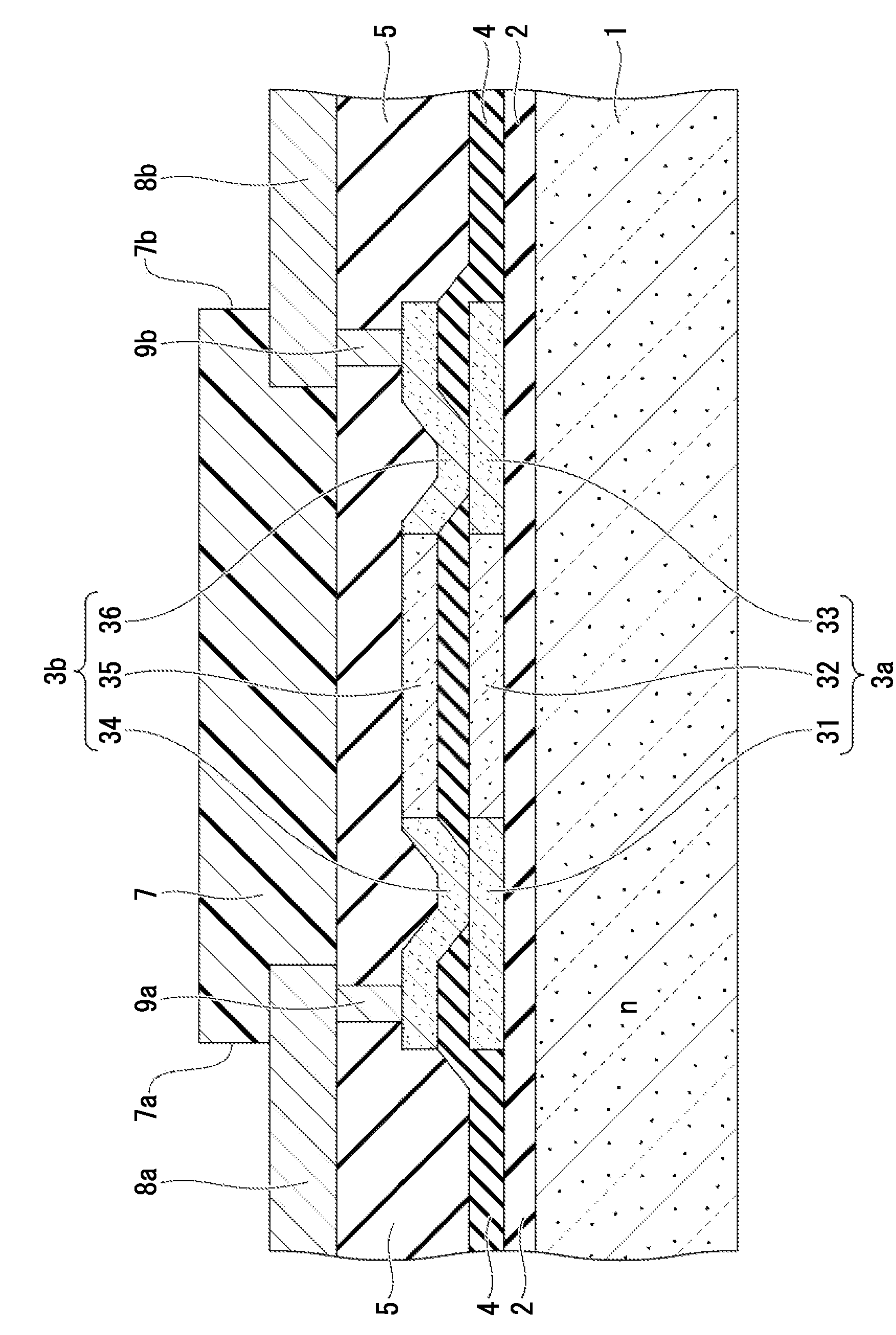
FIG. 22 is a cross-sectional view as viewed from direction A-A' in FIG. 21.

FIG. 22 is a cross-sectional view taken along line A-A' passing across the resistance stacked structure 3 illustrated in FIG. 21. As illustrated in FIG. 22, the first resistance layer 3*a* and the second resistance layer 3*b* are connected in parallel with each other. The first resistance layer 3*a* includes the body part 32, the contact part 31 provided on one side of the body part 32 and having a higher impurity concentration than the body part 32, and the contact part 33 provided on the other side of the body part 32 and having a higher impurity concentration than the body part 32.

The second resistance layer 3*b* includes the body part 35, the contact part 34 provided on one side of the body part 35 and having a higher impurity concentration than the body part 35, and the contact part 36 provided on the other side of the body part 35 and having a higher impurity concentration than the body part 35. The contact part 34 is in ohmic contact with the contact part 31 of the first resistance layer 3*a* at a low contact resistance. The contact part 34 is electrically connected to the top-surface electrode 8*a* through a via 9*a*. The contact part 34 is in ohmic contact with the via 9*a* at a low contact resistance.

The contact part 36 is in ohmic contact with the contact part 33 of the first resistance layer 3*a* at a low contact resistance. The contact part 36 is electrically connected to the top-surface electrode 8*b* through a via 9*b*. The contact part 36 is in ohmic contact with the via 9*b* at a low contact resistance. The other configurations of the semiconductor device according to the seventh embodiment are the same as those of the semiconductor device according to the first embodiment, and overlapping explanations are not repeated below.

The semiconductor device according to the seventh embodiment, which is the horizontal resistive element including the two top-surface electrodes 8*a* and 8*b* on the top surface side, can also adjust the resistance value without the change in the chip size, and avoid the variation in the resistance value accordingly due to the first resistance layer 3*a* and the second resistance layer 3*b* stacked together.

Eighth Embodiment

Figure 23:
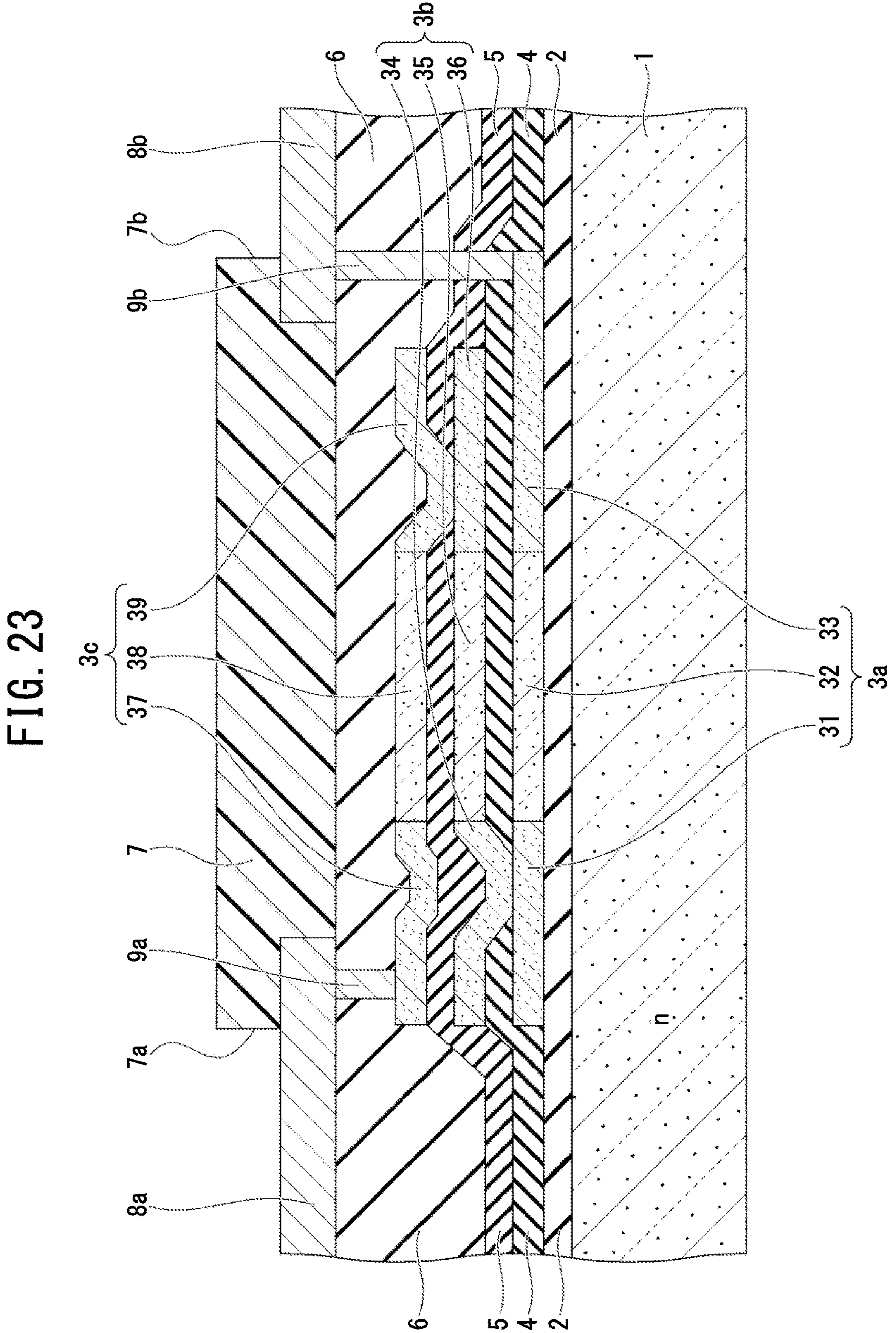
FIG. 23 is a plan view illustrating a semiconductor device according to an eighth embodiment.

A semiconductor device according to an eighth embodiment has the same configuration as the seventh embodiment in including the two top-surface electrodes 8*a* and 8*b* on the top surface side, as illustrated in FIG. 23. The semiconductor device according to the eighth embodiment differs from the semiconductor device according to the seventh embodiment in that the three resistance layers of the first resistance layer 3*a*, the second resistance layer 3*b*, and the third resistance layer 3*c* are stacked together so as to be folded back to be connected in series.

The first resistance layer 3*a* includes the body part 32, the contact part 31 provided on one side of the body part 32 and having a higher impurity concentration than the body part 32, and the contact part 33 provided on the other side of the body part 32 and having a higher impurity concentration than the body part 32. The contact part 33 is electrically connected to the top-surface electrode 8*b* through the via 9*b*. The contact part 33 is in ohmic contact with the via 9*b* at a low contact resistance.

The second resistance layer 3*b* includes the body part 35, the contact part 34 provided on one side of the body part 35 and having a higher impurity concentration than the body part 35, and the contact part 36 provided on the other side of the body part 35 and having a higher impurity concentration than the body part 35. The contact part 34 is in ohmic contact with the contact part 31 of the first resistance layer 3*a* at a low contact resistance.

The third resistance layer 3*c* includes the body part 38, the contact part 37 provided on one side of the body part 38 and having a higher impurity concentration than the body part 38, and the contact part 39 provided on the other side of the body part 38 and having a higher impurity concentration than the body part 38. The contact part 39 is in ohmic contact with the contact part 36 of the second resistance layer 3*b* at a low contact resistance. The contact part 37 is electrically connected to the top-surface electrode 8*a* through the via 9*a*. The contact part 37 is in ohmic contact with the via 9*a* at a low contact resistance. The other configurations of the semiconductor device according to the eighth embodiment are the same as those of the semiconductor device according to the seventh embodiment, and overlapping explanations are not repeated below.

The semiconductor device according to the eighth embodiment, which is the horizontal resistive element including the two top-surface electrodes 8*a* and 8*b* on the top surface side, can also adjust the resistance value without the change in the chip size, and avoid the variation in the resistance value accordingly due to the first resistance layer 3*a*, the second resistance layer 3*b*, and the third resistance layer 3*c* stacked together. While the eighth embodiment is illustrated with the case of including the three resistance layers stacked together, the odd-numbered layers of five or more layers may be stacked together so as to be folded back to be connected in series.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

While the semiconductor device according to the first embodiment is illustrated with the case of being used as the first gate resistive element R1 to the twelfth gate resistive element R12, the present invention is not intended to be limited to this case. The respective semiconductor devices according to the first to eighth embodiments can be used as resistive elements for various types of ICs.

The configurations disclosed in the first to eighth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:

1. A semiconductor device comprising:
- a semiconductor substrate;
- a first insulating film provided on one surface of the semiconductor substrate;
- a first resistance layer including polysilicon provided on the first insulating film;
- a second insulating film provided on the first resistance layer;
- a second resistance layer including polysilicon provided on the second insulating film so as to have at least a part overlapping with the first resistance layer;
- a third insulating film provided on the second resistance layer;
- a first electrode provided over the third insulating film and electrically connected to the second resistance layer; and
- a second electrode electrically connected to the first resistance layer, wherein
  - the first resistance layer includes:
    - a body part, and
    - a first contact part having a higher impurity concentration than the body part of the first resistance layer, and
  - the second resistance layer includes:
    - a body part, and
    - a first contact part having a higher impurity concentration than the body part of the second resistance layer,
  - the first contact part of the first resistance layer and the first contact part of the second resistance layer are in contact with each other via a contact hole provided in the second insulating film,
  - an electrical resistivity of the body part of the first resistance layer and an electrical resistivity of the body part of the second resistance layer each configure an electrical resistance to a current flowable through the body part of the first resistance layer and the body part of the second resistance layer between the first electrode and the second electrode, and
  - the first resistance layer and the second resistance layer are connected in parallel with each other.

2. The semiconductor device of claim 1, wherein the second electrode is provided on another surface of the semiconductor substrate.

3. The semiconductor device of claim 1, wherein the first resistance layer and the second resistance layer are folded back so as to be connected in series inside an outer circumference of the first electrode.

4. The semiconductor device of claim 1, wherein:
- the first resistance layer further includes a second contact part that interposes the body part of the first resistance layer together with the first contact part of the first resistance layer, and that has a higher impurity concentration than the body part of the first resistance layer,
- the second resistance layer further includes a second contact part that interposes the body part of the second resistance layer together with the first contact part of the second resistance layer, and that has a higher impurity concentration than the body part of the second resistance layer,
- the second contact part of the first resistance layer is in contact with the semiconductor substrate, and
- the second contact part of the second resistance layer is in contact with a via connected to the first electrode.

5. The semiconductor device of claim 1, wherein the first resistance layer and the second resistance layer are connected in parallel with each other.

6. The semiconductor device of claim 1, wherein:
- the first resistance layer further includes a second contact part that interposes the body part of the first resistance layer together with the first contact part of the first resistance layer, and that has a higher impurity concentration than the body part of the first resistance layer,
- the second resistance layer further includes a second contact part that interposes the body part of the second resistance layer together with the first contact part of the second resistance layer, and that has a higher impurity concentration than the body part of the second resistance layer,
- the second contact part of the first resistance layer and the second contact part of the second resistance layer are in contact with each other,
- the first contact part of the first resistance layer is in contact with the semiconductor substrate, and
- the second contact part of the second resistance layer is in contact with a via connected to the first electrode.

7. The semiconductor device of claim 1, further comprising:
- a third resistance layer including polysilicon provided on the third insulating film so as to have at least a part overlapping with the second resistance layer; and
- a fourth insulating film provided on the third resistance layer,
- wherein the third resistance layer includes:
  - a body part, and
  - a first contact part having a higher impurity concentration than the body part of the third resistance layer,
- the first contact part of the second resistance layer and the first contact part of the third resistance layer are in contact with each other via a contact hole provided in the third insulating film, and
- the first electrode is electrically connected to the second resistance layer via the third resistance layer.

8. The semiconductor device of claim 1, further comprising a plurality of stacked structures each including the first resistance layer and the second resistance layer along a circumference of the first electrode.

9. The semiconductor device of claim 1, wherein the second electrode is provided separately from the first electrode over the third insulating film.

10. The semiconductor device of claim 1, wherein:

the first resistance layer further includes a second contact part that interposes the body part of the first resistance layer together with the first contact part of the first resistance layer, and that has a higher impurity concentration than the body part of the first resistance layer, the second resistance layer further includes a second contact part that interposes the body part of the second resistance layer together with the first contact part of the second resistance layer, and that has a higher impurity concentration than the body part of the second resistance layer, the second contact part of the first resistance layer and the second contact part of the second resistance layer are in contact with each other, the first contact part of the second resistance layer is in contact with a via connected to the first electrode, and the second contact part of the second resistance layer is in contact with a via connected to the second electrode.

11. The semiconductor device of claim 1, wherein the first resistance layer and/or the second resistance layer has a width of greater than or equal to 400 micrometers.

12. The semiconductor device of claim 1, wherein the first resistance layer has a ratio (W/L) of a width of the first resistance layer (W) to a length of the first resistance layer (L) of greater than or equal to 3.3.

13. The semiconductor device of claim 1, wherein the first resistance layer has a temperature coefficient of less than or equal to 0 parts per million per degrees Celsius) (ppm/° C.).

14. The semiconductor device of claim 1, wherein the body part of the first resistance layer and the body part of the second resistance layer have different widths and/or different lengths.

15. The semiconductor device of claim 1, wherein the first insulating film, the first resistance layer, the second insulating film, the second resistance layer, and the third insulating film form a resistance stacked structure, the resistance stacked structure is among a plurality of resistance stacked structures provided on respective sides of the semiconductor device, and viewed from a top surface of the semiconductor device the plurality of resistance stacked structures have four-fold rotational symmetry about a center of the semiconductor device.

16. The semiconductor device of claim 1, further comprising a passivation film provided on at least a portion of the first electrode.

17. The semiconductor device of claim 1, wherein an edge of the first resistance layer is closer to a center of the semiconductor device than an edge of the second resistance layer.

* * * * *